(12) United States Patent
Saucedo-Flores et al.

(10) Patent No.: US 8,093,133 B2
(45) Date of Patent: Jan. 10, 2012

(54) TRANSIENT VOLTAGE SUPPRESSOR AND METHODS

(75) Inventors: Emmanuel Saucedo-Flores, Jalisco (MX); Mingjiao Liu, Gilbert, AZ (US); Francine Y. Robb, Fountain Hills, AZ (US); Ali Salih, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 441 days.

(21) Appl. No.: 12/098,369

(22) Filed: Apr. 4, 2008

(65) Prior Publication Data

US 2009/0250720 A1 Oct. 8, 2009

(51) Int. Cl.
*H01L 21/20* (2006.01)
(52) U.S. Cl. ........ 438/380; 438/514; 438/542; 438/549; 257/105; 257/106; 257/481; 257/E21.091; 257/E29.335

(58) Field of Classification Search .................. None
See application file for complete search history.

(56) References Cited

U.S. PATENT DOCUMENTS

| | | | | |
|---|---|---|---|---|
| 5,245,412 A | * | 9/1993 | Clark et al. ................. | 257/601 |
| 6,075,276 A | * | 6/2000 | Kitamura ................... | 257/481 |
| 6,392,266 B1 | | 5/2002 | Robb et al. | |
| 6,515,345 B2 | | 2/2003 | Robb et al. | |
| 6,867,436 B1 | * | 3/2005 | Matteson et al. ............ | 257/106 |
| 7,102,199 B2 | | 9/2006 | Robb et al. | |
| 7,244,970 B2 | * | 7/2007 | Cogan et al. ................. | 257/173 |
| 7,781,826 B2 | * | 8/2010 | Mallikararjunaswamy et al. ............................. | 257/328 |

\* cited by examiner

*Primary Examiner* — Zandra Smith
*Assistant Examiner* — Khanh Duong
(74) *Attorney, Agent, or Firm* — Rennie William Dover

(57) ABSTRACT

Transient voltage suppressor and method for manufacturing the transient voltage suppressor having a dopant or carrier concentration in a portion of a gate region near a Zener region that is different from a dopant concentration in a portion of a gate region that is away from the Zener region.

14 Claims, 11 Drawing Sheets

600

TRANSIENT VOLTAGE SUPPRESSOR AND METHODS

TECHNICAL FIELD

The present invention relates, in general, to semiconductor components and, more particularly, to transient voltage suppressor devices.

BACKGROUND

Transient voltage suppressors are used in a variety of electrical systems to prevent high voltage transients from damaging system components. For example, computer systems connect transient voltage suppressors across data and/or power lines to dissipate the energy induced by a transient event such as a noise pulse, a static discharge, or a lightning strike. The transient suppressors break down when a transient voltage exceeds a predetermined level, thereby limiting the voltage on the data and power lines and avoiding component damage. A typical transient suppressor breaks down when a transient voltage exceeds eight volts and shunts at least one ampere of current which would otherwise flow through other system components and lead to a destructive failure of the system.

One type of transient voltage suppressor uses large Zener or avalanche diodes to dissipate the current associated with the transient event. A drawback with large Zener diodes is that they have a large capacitance which loads the data lines and slows down the data transfer rate. Another transient voltage suppressor comprises a device having a Zener region and a non-Zener region, where the Zener region controls the Zener voltage of the device. A drawback with this type of device is that the Zener region includes an NPN transistor that has a higher gain than the non-Zener region. During a surge, the current may be localized in the Zener region resulting in a local hot spot that degrades the device performance. The effects of the NPN transistor may be mitigated by increasing the size of the Zener region, however this introduces an undesirably high capacitance.

Accordingly, it would be advantageous to have a transient voltage suppressor device that includes a Zener region, a method for manufacturing the transient voltage suppressor device, and a method for handling the gain of the Zener region of a transient voltage suppressor device that do not introduce a large capacitance in the device. It would be of further advantage for the device and method to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
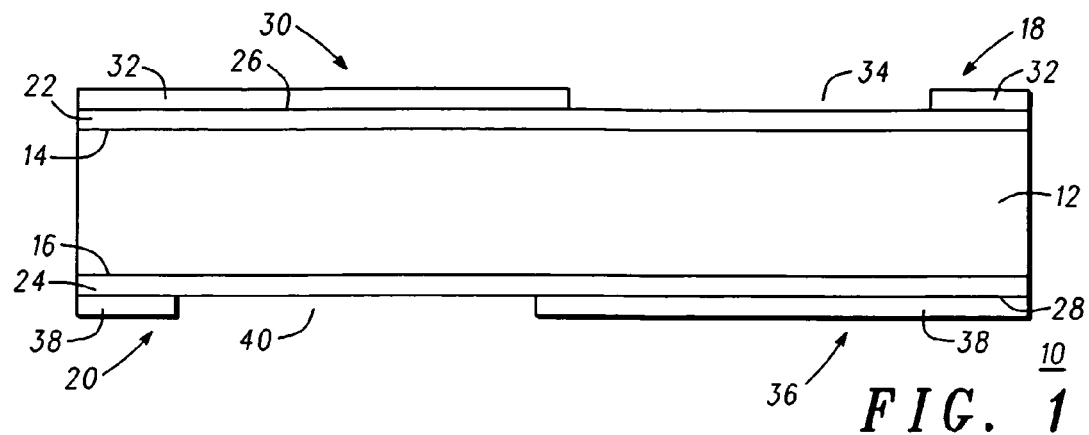
FIG. 1 is a cross-sectional view of a semiconductor component at an early stage of manufacture in accordance with an embodiment of the present invention.

FIG. 1 is a cross-sectional view of a portion of a transient voltage suppressor device 10 at an early stage of manufacture in accordance with an embodiment of the present invention. Transient voltage suppressor devices are also referred to as transient surge protection devices. Examples of transient voltage suppressor devices include thyristors, silicon controlled rectifiers (SCRs), triacs, sidacs, diacs, or the like. What is shown in FIG. 1 is a semiconductor substrate 12 having surfaces 14 and 16. Surface 14 is on side 18 of semiconductor substrate 12 and surface 16 is on side 20 of semiconductor substrate 12. Semiconductor substrate 12 has a thickness ranging from about 170 micrometers (7 mils) to about 350 micrometers (14 mils). In accordance with an embodiment of the present invention, semiconductor substrate 12 has a thickness of about 270 micrometers (11 mils), is doped with an impurity material or dopant of N-type conductivity, and has a dopant concentration ranging from about $5 \times 10^{13}$ atoms per cubic centimeter (atoms/cm) to about $3 \times 10^{14}$ atoms/cm$^3$. In other words, the resistivity of semiconductor substrate 12 may range from about 20 Ohm-centimeters ($\Omega$-cm) to about 100 $\Omega$-cm and more particularly from about 45 $\Omega$-cm to about 55 $\Omega$-cm. Suitable dopants of N-type conductivity include phosphorus and arsenic. It should be noted that the type of impurity material and the conductivity type of the impurity material of semiconductor substrate 12 are not limitations of the present invention. Alternatively, semiconductor substrate 12 can be doped with an impurity material of P-type conductivity. It should be understood that when semiconductor substrate 12 is doped with an impurity material of P-type conductivity, the doped regions described hereinbelow would have the opposite conductivity type.

Dielectric layers 22 and 24 are formed on sides 18 and 20, respectively, of semiconductor substrate 12. Preferably, semiconductor substrate 12 is oxidized from sides 18 and 20 to form oxide layers 22 and 24 having surfaces 26 and 28, respectively. However, dielectric layers 22 and 24 are not limited to being oxide. Although the oxidation of semiconductor substrate 12 consumes semiconductor substrate 12 at surfaces 14 and 16, the reference numbers for the surfaces of semiconductor substrate 12 are preserved for the sake of clarity. A layer of photoresist is formed on surface 26 of dielectric layer 22 and a layer of photoresist is formed on surface 28 of dielectric layer 24 using techniques known to those skilled in the art. The photoresist layer on surface 26 is patterned to form an etch mask 30 having masking features 32 and an opening 34 and the photoresist layer on surface 28 is patterned to form an etch mask 36 having masking features 38 and an opening 40. Opening 34 exposes a portion of dielectric layer 22 and opening 40 exposes a portion of dielectric layer 24. Etch masks 30 and 36 may also be referred to as anode photomasks.

Figure 2:
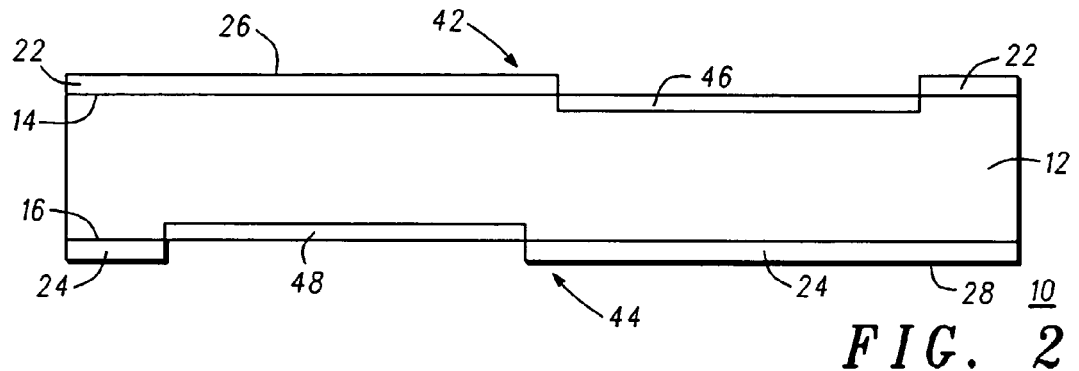
FIG. 2 is a cross-sectional view of the semiconductor component of FIG. 1 at a later stage of manufacture.

Referring now to FIG. 2, the exposed portions of dielectric layers 22 and 24 are anisotropically etched using either a dry etch or a wet etch to expose portions of surfaces 14 and 16. By way of example, the exposed portions of dielectric layers 22 and 24 are etched using hydrofluoric (HF) acid. Etch masks 30 and 36 are removed and the remaining portions of dielectric layers 22 and 24 serve as doping masks or diffusion masks. Although portions 42 and 44 of dielectric layers 22 and 24, respectively, overlap, this is not a limitation of the present invention. The amount of overlap of portions 42 and 44 is not a limitation of the present invention.

An impurity material of P type conductivity is deposited on the exposed portions of surfaces 14 and 16 of semiconductor substrate 12 to form predeposition layers 46 and 48, respectively. In a subsequent step, the impurity materials of predeposition layers 46 and 48 are driven into semiconductor substrate 12 to form deep anode regions. Thus, predeposition layers 46 and 48 are also referred to as anode predeposition layers or pre-anode layers. By way of example, the impurity material is boron and is deposited to have a resistivity ranging from about 2 Ohms per square ($\Omega$/square) to about 400 $\Omega$/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming predeposition layers 46 and 48, surfaces 26 and 28, and the exposed portions of surfaces 14 and 16 are cleaned using, for example, dilute hydrofluoric acid.

Figure 3:
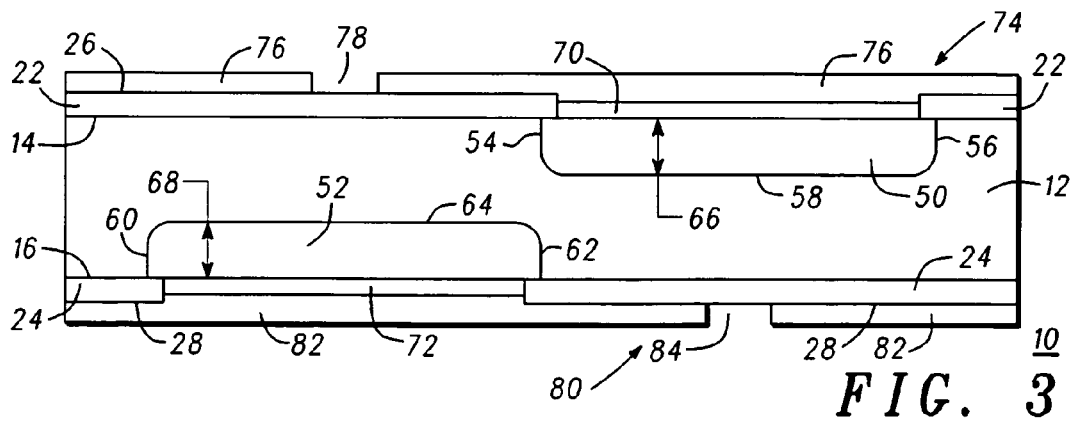
FIG. 3 is a cross-sectional view of the semiconductor component of FIG. 2 at a later stage of manufacture.

Referring now to FIG. 3, the impurity material of predeposition layers 46 and 48 is driven into semiconductor substrate 12 to form doped regions 50 and 52. Doped regions 50 and 52 are also referred to as deep anode regions. Deep anode regions 50 and 52 reduce the width of the bulk region of semiconductor substrate 12. The drive-in is performed for a time ranging from about 20 hours to about 225 hours at a temperature ranging from about 1,250 degrees Celsius (° C.) to about 1,280° C. Doped region 50 extends from surface 14 into semiconductor substrate 12, has lateral boundaries 54 and 56, a vertical boundary 58, and serves as an anode region of transient voltage suppressor device 10. Doped region 52 extends from surface 16 into semiconductor substrate 12, has lateral boundaries 60 and 62, a vertical boundary 64, and serves as another anode region of transient voltage suppressor device 10. The distance from surface 14 to vertical boundary 58 represents a junction depth 66 and the distance from surface 16 to vertical boundary 64 represents a junction depth 68. Driving in predeposition layers 46 and 48, i.e., forming doped regions 50 and 52, oxidizes the exposed portions of surfaces 14 and 16 thereby forming oxide or dielectric layers 70 and 72, respectively. Preferably, the thicknesses of oxide layers 70 and 72 is less than about 10,000 Angstroms (Å) and even more preferably about 8,000 Å.

A layer of photoresist is formed on surface 26 of dielectric layer 22 and on dielectric layer 70 and a layer of photoresist is formed on surface 28 of dielectric layer 24 and on dielectric layer 72 using techniques known to those skilled in the art. The photoresist layer on surface 26 and oxide layer 70 is patterned to form an etch mask 74 having masking features 76 and an opening 78 and the photoresist layer on surface 28 and oxide layer 72 is patterned to form an etch mask 80 having masking features 82 and an opening 84. Opening 78 exposes a portion of dielectric layer 22 and opening 84 exposes a portion of dielectric layer 24. Although openings 78 and 84 are shown as being laterally centered within doped regions 50 and 52, respectively, this is not a limitation of the present invention. In other words, openings 78 and 84 may be laterally asymmetric with respect to doped regions 50 and 52. Etch masks 74 and 80 are also referred to as Zener zone etch masks or Zener zone masking structures.

Figure 4:
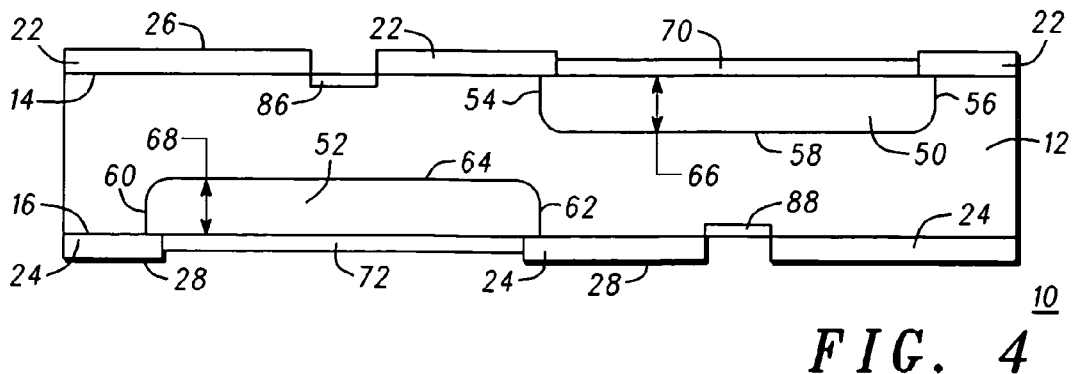
FIG. 4 is a cross-sectional view of the semiconductor component of FIG. 3 at a later stage of manufacture.

Referring now to FIG. 4, the exposed portions of dielectric layers 22 and 24 are anisotropically etched using either a dry etch or a wet etch to expose portions of surfaces 14 and 16. By way of example, the exposed portions of dielectric layers 22 and 24 are etched using hydrofluoric (HF) acid. An impurity material of N-type conductivity is deposited on the exposed portions of surfaces 14 and 16 to form predeposition layers 86 and 88, respectively. Predeposition layers 86 and 88 are also referred to as Zener Zone predeposition layers because they form Zener zones during a subsequent drive-in step. By way of example, the impurity material is phosphorus or a phosphorus containing material that is deposited to have a resistivity ranging from about 100 Ω/square to about 1,000 Ω/square. Suitable sources of phosphorus include phosphorus oxytrichloride ($POCl_3$), phosphine ($PH_3$), phosphorus pentaoxide, or the like. The phosphorus can be disposed on surfaces 14 and 16 by ion implantation. Zener zone etch masks 74 and 80 are removed.

Figure 5:
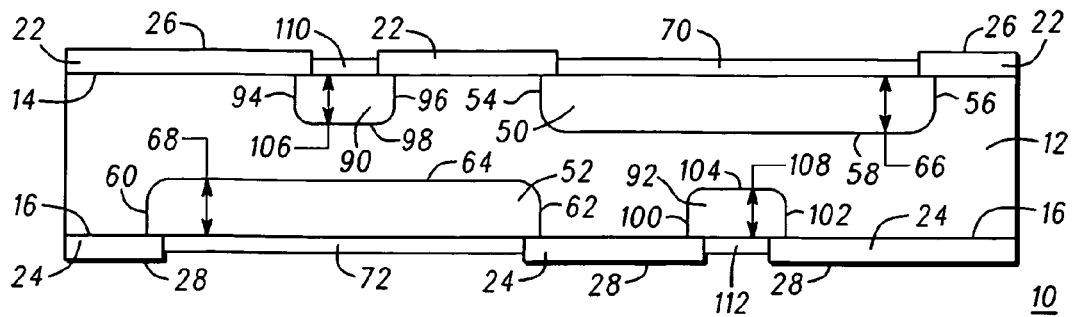
FIG. 5 is a cross-sectional view of the semiconductor component of FIG. 4 at a later stage of manufacture.

Referring now to FIG. 5, the impurity materials of predeposition layers 86 and 88 are driven into semiconductor substrate 12 to form doped regions 90 and 92. Doped regions 90 and 92 are also referred to as Zener zones. The drive-in is performed for a time ranging from about 1 hour to about 20 hours at a temperature ranging from about 1,250° C. to about 1,280° C. Doped region 90 extends from surface 14 into semiconductor substrate 12, has lateral boundaries 94 and 96, a vertical boundary 98, and serves as a Zener zone or Zener region of transient voltage suppressor device 10. Doped region 92 extends from surface 16 into semiconductor substrate 12, has lateral boundaries 100 and 102, a vertical boundary 104, and serves as another Zener zone or Zener region of transient voltage suppressor device 10. The distance from surface 14 to vertical boundary 98 represents a diffusion depth 106 and the distance from surface 16 to vertical boundary 94 represents a diffusion depth 108. Driving in predeposition layers 86 and 88, i.e., forming Zener zones 90 and 92, oxidizes the exposed portions of surfaces 14 and 16 thereby forming oxide or dielectric layers 110 and 112, respectively. It should be noted that oxide layers 110 and 112 are formed in a dry ambient, thus their thicknesses are less than about 5,000 Å. Oxide layers 110 and 112 are thinner than oxide layers 70 and 72, respectively. As those skilled in the art are aware, oxidizing a semiconductor material such as silicon consumes portions of the silicon. Accordingly, oxide layers 110 and 112 extend below surfaces 14 and 16, respectively.

Figure 6:
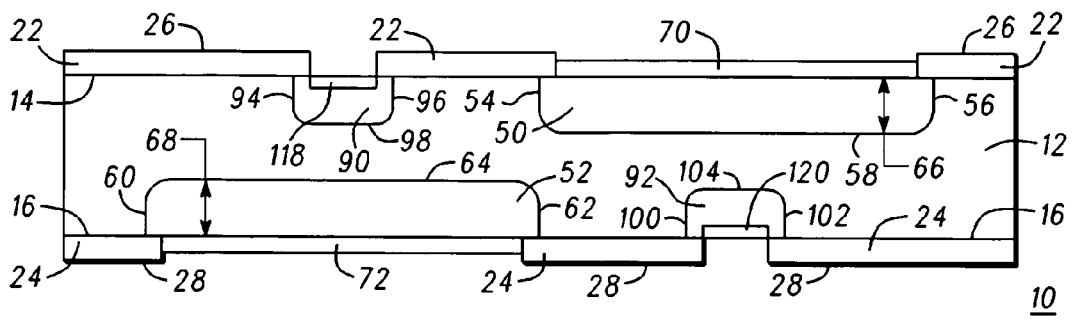
FIG. 6 is a cross-sectional view of the semiconductor component of FIG. 5 at a later stage of manufacture.

Referring now to FIG. 6, dielectric layers 110 and 112 are anisotropically etched using either a dry etch or a wet etch to expose portions of surfaces 14 and 16. By way of example, dielectric layers 110 and 112 are etched using hydrofluoric (HF) acid. Because dielectric layers 110 and 112 extend below surfaces 12 and 14, their removal leaves notches (not shown) in the exposed portions of substrate 12. The etch that removes dielectric layers 110 and 112 also removes portions of dielectric layers 22, 24, 70, and 72. However, dielectric layers 22, 24, 70, and 72 remain over substrate 12 because they are thicker than dielectric layers 110 and 112. An advantage of making dielectric layers 110 and 112 and dielectric layers 22, 24, 70, and 72 of different thicknesses is that dielectric layers 110 and 112 can be removed to open or expose portions of substrate 12 without using an additional masking layer to protect dielectric layers 22, 24, 70, and 72.

An impurity material of P type conductivity is deposited on the exposed portions of surfaces 14 and 16 of semiconductor substrate 12 to form predeposition layers. By way of example, the impurity material is boron and is deposited to have a resistivity ranging from about 2 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming the predeposition layers, surfaces 26 and 28, the exposed portions of surfaces 14 and 16, and the surfaces of dielectric layers 70 and 72 are cleaned using, for example, dilute hydrofluoric acid. Cleaning these surfaces removes the portions of the predeposition layers from surfaces 26 and 28 and from the surfaces of the dielectric layers 70 and 72, leaving predeposition layers 118 and 120. Predeposition layers 118 and 120 are also referred to as gate predeposition layers or first gate predeposition layers because another set of gate predeposition layers is formed in a subsequent step. The impurity material of gate predeposition layers 118 and 120 adjusts the gain of the bipolar transistor formed in the Zener zone.

Figure 7:
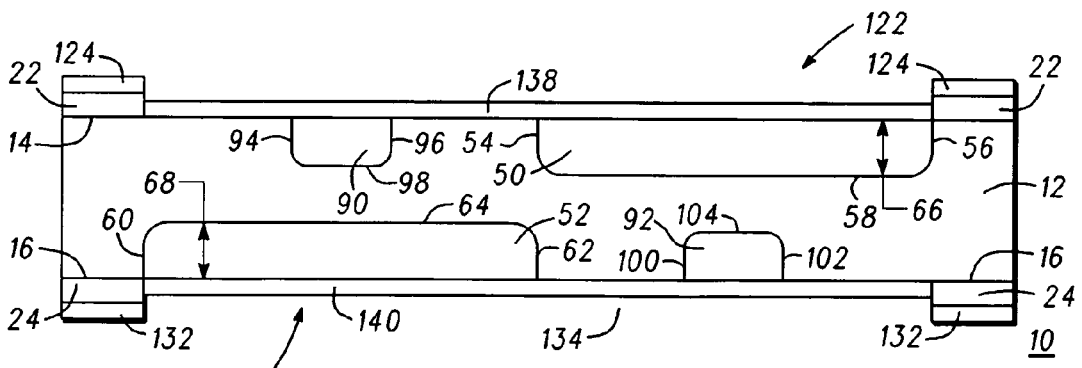
FIG. 7 is a cross-sectional view of the semiconductor component of FIG. 6 at a later stage of manufacture.

Referring now to FIG. 7, a layer of photoresist is formed on gate predeposition layer 118, dielectric layer 22, and dielectric layer 70 and a layer of photoresist is formed on gate predeposition layer 120, dielectric layer 24, and dielectric layer 72 using techniques known to those skilled in the art. The photoresist layer on gate predeposition layer 118 and dielectric layers 22 and 70 is patterned to form an etch mask 122 having masking features 124 and an opening 126 and the photoresist layer on gate predeposition layer 120 and dielectric layers 24 and 72 is patterned to form an etch mask 130 having masking features 132 and an opening 134. Opening 126 exposes doped regions 50 and 90 and portions of substrate 12 adjacent to doped regions 50 and 90 and opening 134 exposes doped regions 52 and 92 and portions of substrate 12 adjacent to doped regions 52 and 92.

An impurity material of P type conductivity is deposited on the portions of surfaces 14 and 16 exposed by openings 126 and 134, respectively, to form predeposition layers. By way of example, the impurity material is boron and is deposited to have a resistivity ranging from about 10 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming the predeposition layers, etch masks 122 and 130 are removed and the remaining portions of surfaces 26 and 28 are cleaned using, for example, dilute hydrofluoric acid. Cleaning these surfaces removes the portions of the predeposition layers from surfaces 26 and 28, leaving predeposition layers 138 and 140. Predeposition layers 138 and 140 are also referred to as gate predeposition layers or second gate predeposition layers. Second gate predeposition layers 138 and 140 increase the dopant concentrations of first gate predeposition layers 118 and 120, respectively. For the sake of clarity, first gate predeposition layers 118 and 120 and second gate predeposition layers 138 and 140 are collectively referred to as gate predeposition layers 138 and 140. However, it should be noted that formation of first gate predeposition layers 118 and 120 selectively increases the gate dopant concentration in the Zener region compared to the non-Zener regions, i.e., the remaining device active regions. In other words, including gate predeposition layers 118 and 120 results in the selective introduction of a higher gate dose in the previously created Zener region and a lighter gate dose in the remaining active device regions.

Figure 8:
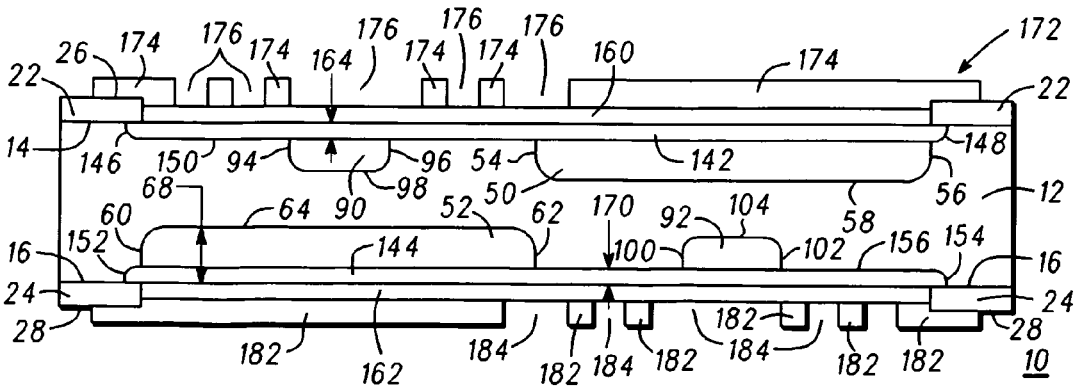
FIG. 8 is a cross-sectional view of the semiconductor component of FIG. 7 at a later stage of manufacture.

Referring now to FIG. 8, the impurity material of predeposition layers 138 and 140 is driven into semiconductor substrate 12 to form doped regions 142 and 144. Doped regions 142 and 144 are also referred to as gate regions and include the impurity materials of the respective gate predeposition layers 118, 138, 120, and 140. The drive-in is performed for a time ranging from about 1 hour to about 20 hours at a temperature ranging from about 1,250° C. to about 1,280° C. Doped or gate region 142 extends from surface 14 into semiconductor substrate 12, has lateral boundaries 146 and 148, and a vertical boundary 150. Doped or gate region 144 extends from surface 16 into semiconductor substrate 12, has lateral boundaries 152 and 154, and a vertical boundary 156. The distance from surface 14 to vertical boundary 98 represents a diffusion depth 106 and the distance from surface 16 to vertical boundary 94 represents a diffusion depth 108. Driving in predeposition layers 138 and 140, i.e., forming doped regions 142 and 144, oxidizes the exposed portions of surfaces 14 and 16 thereby forming oxide or dielectric layers 160 and 162, respectively. Oxide layers 160 and 162 have thicknesses ranging from about 5,000 Å to about 25,000 Å. As those skilled in the art are aware, oxidizing a semiconductor material such as silicon consumes portions of the silicon. Thus, oxide layers 160 and 162 extend below surfaces 14 and 16, respectively. The distances 164 and 166 between oxide layer 160 and doped region 90 and between oxide layer 162 and doped region 92 are diffusion depths that preferably range from about 15 micrometers (μm) to about 20 μm. The distances 168 and 170 between oxide layer 160 and vertical boundary 150 and between oxide layer 162 and vertical boundary 156 are diffusion depths that preferably range from about 25 micrometers (μm) to about 30 μm.

A layer of photoresist is formed on dielectric layer 22 and dielectric layer 160 and a layer of photoresist is formed on dielectric layer 24 and dielectric layer 162 using techniques known to those skilled in the art. The photoresist layer on dielectric layers 22 and 160 is patterned to form an etch mask 172 having masking features 174 and openings 176 and the photoresist layer on dielectric layers 24 and 162 is patterned to form an etch mask 180 having masking features 182 and openings 184. Openings 176 expose portions of dielectric layers 22 and 160 laterally adjacent to regions 50 and 90 and openings 184 expose portions of dielectric layers 24 and 162 laterally adjacent to doped regions 52 and 92. Etch masks 172 and 180 are also referred to as cathode etch masks, cathode masking structures, or cathode etch masking structures.

Figure 9:
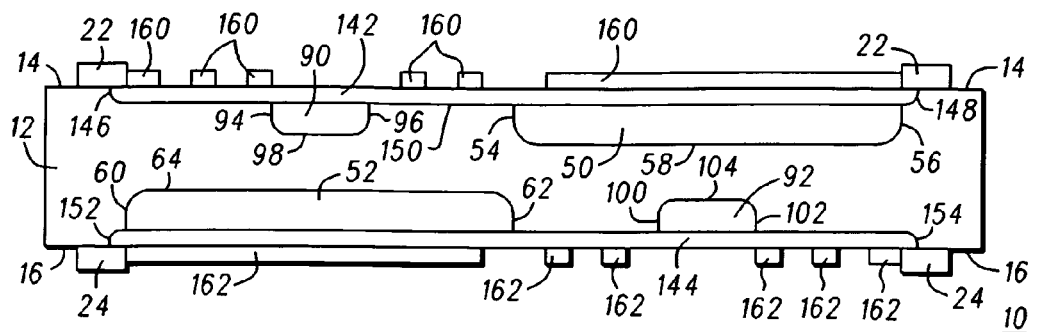
FIG. 9 is a cross-sectional view of the semiconductor component of FIG. 8 at a later stage of manufacture.

Referring now to FIG. 9, the exposed portions of dielectric layers 22, 24, 160, and 162 are anisotropically etched using either a dry etch or a wet etch to expose portions of doped regions 142 and 144. By way of example, the exposed portions of dielectric layers 22, 24, 160, and 162 are etched using hydrofluoric (HF) acid. Etch masks 172 and 180 are removed.

Figure 10:
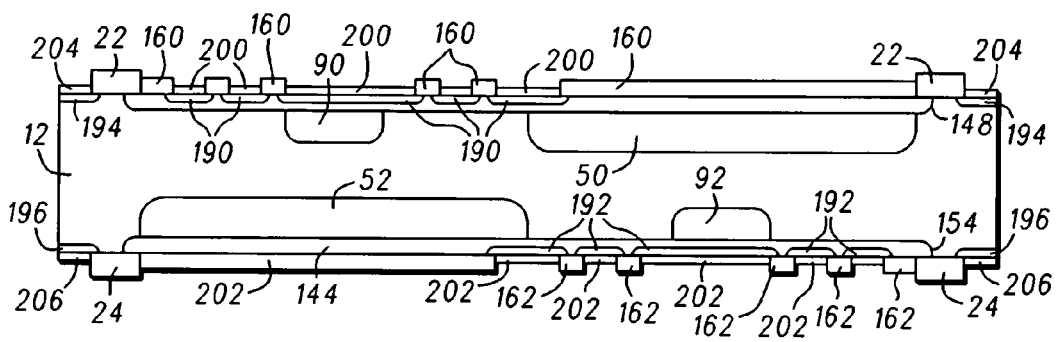
FIG. 10 is a cross-sectional view of the semiconductor component of FIG. 9 at a later stage of manufacture.

Referring now to FIG. 10, an impurity material of N-type conductivity is deposited on the exposed portions of doped regions 142 and 144 to form predeposition layers 190 and 192, respectively. Predeposition layers 190 and 192 are also referred to as cathode predeposition layers. The impurity material of N-type conductivity is also deposited on the exposed portions of surfaces 14 and 16 to form predeposition layers 194 and 196, respectively. By way of example, the impurity material is phosphorus or a phosphorus containing material that is deposited to have a resistivity ranging from about 0.25 Ω/square to about 10 Ω/square. Suitable sources of phosphorus include phosphorus oxytrichloride (POCl$_3$), phosphine (PH$_3$), phosphorus pentaoxide, or the like. In accordance with an embodiment, phosphorus is disposed on doped regions 142 and 144 and the exposed portions of surfaces 14 and 16 by ion implantation.

Dielectric layers 200 and 202 having thicknesses ranging from about 500 Å to about 10,000 Å are formed from the exposed portions of doped regions 142 and 144 in which the respective cathode predeposition layers 190 and 192 have been formed. In addition, dielectric layers 204 and 206 having thicknesses ranging from about 500 Å to about 10,000 Å are formed from the exposed portions of substrate 12. By way of example, dielectric layers 200, 202, 204, and 206 are oxide layers formed in a dry ambient at a temperature ranging from about 970° C. to about 1,200° C. for a time ranging from about one minute to about one hundred minutes.

Figure 11:
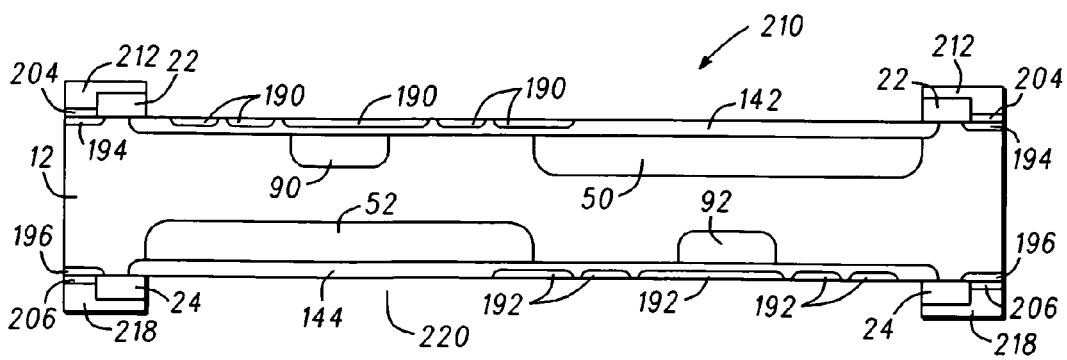
FIG. 11 is a cross-sectional view of the semiconductor component of FIG. 10 at a later stage of manufacture.

Referring now to FIG. 11, a layer of photoresist is formed on dielectric layers 22, 160, 200, and 204 and a layer of photoresist is formed dielectric layers 24, 162, 202, and 206 using techniques known to those skilled in the art. The photoresist layer on dielectric layers 22, 160, 200, and 204 is patterned to form an etch mask 210 having masking features 212 and an opening 214 and the photoresist layer on dielectric layers 24, 162, 202, and 206 is patterned to form an etch mask 216 having masking features 218 and an opening 220. Etch masks 210 and 216 are also referred to as pre-Ohmic etch masks or pre-Ohmic masking structures. Opening 214 exposes portions dielectric layers 160 and 200 and opening 220 exposes dielectric layers 162 and 202. The exposed portions of dielectric layers 160, 200, 162, and 202 are anisotropically etched using either a dry etch or a wet etch to expose doped regions 142 and 144 and predeposition layers 190 and 192. By way of example, dielectric layers 160, 200, 162, and 202 are etched using hydrofluoric (HF) acid. Etch masks 210 and 216 are removed.

Alternatively, passivating layers such as, for example, semi-insulating polycrystalline silicon (SIPOS), nitride, oxide, or the like may be formed on dielectric layers 22, 24, 160, 162, 200, 202, 204, and 206 rather than forming etch masks 210 and 216. The passivating layers are then patterned to expose dielectric layers 160, 162, 200, and 202.

Figure 12:
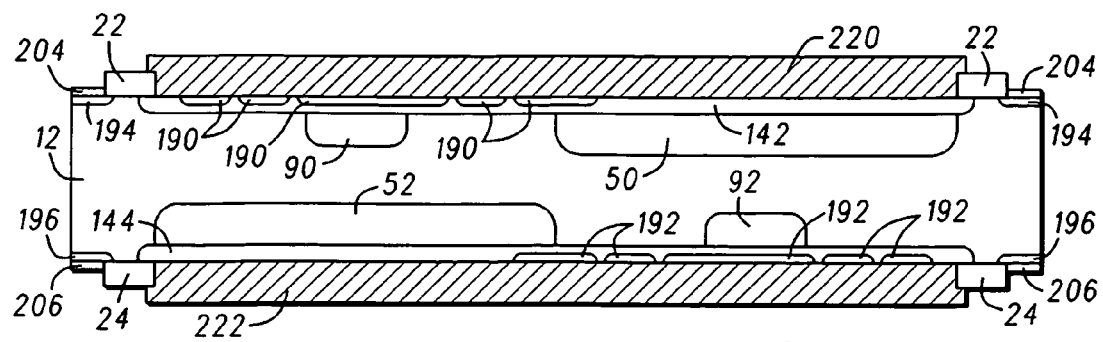
FIG. 12 is a cross-sectional view of the semiconductor component of FIG. 11 at a later stage of manufacture.

Referring now to FIG. 12, a layer of aluminum having a thickness ranging from about one μm to about twenty μm is formed on the dielectric layers 22 and 204 and on the exposed portions of doped region 142 and predeposition layers 190. In addition, a layer of aluminum having a thickness ranging from about one μm to about twenty μm is formed on dielectric layers 24 and 206 and on the exposed portions of doped region 144 and predeposition layers 192. The aluminum layers may be formed by evaporation or other techniques known to those skilled in the art. The layers of aluminum are sintered and patterned so that a portion 220 over doped region 142 and predeposition layers 190 and a portion 222 over doped region 144 and predeposition layer 192 remain. Portions 220 and 222 are also referred to as an aluminum layers.

Figure 13:
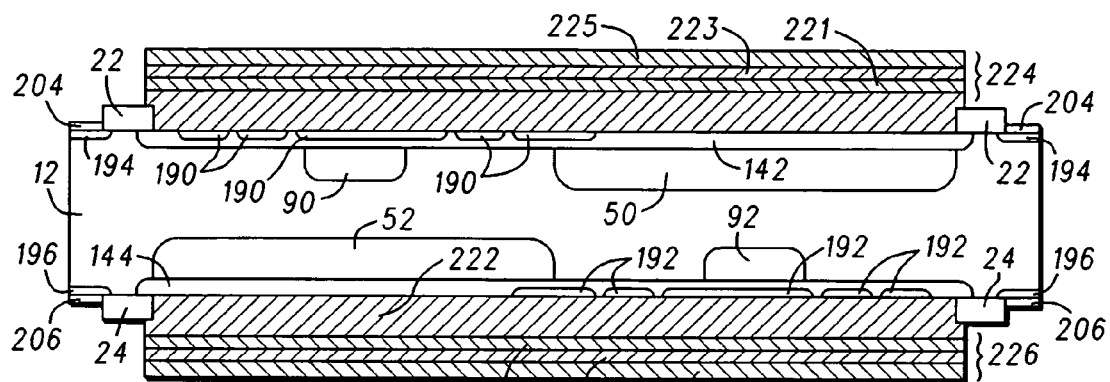
FIG. 13 is a cross-sectional view of the semiconductor component of FIG. 12 at a later stage of manufacture.

Referring now to FIG. 13, a layer of titanium 221 having a thickness ranging from about 0.1 μm to about 1 μm is formed on the dielectric layers 22 and 204 and on aluminum layer 220 and a layer of titanium 227 having a thickness ranging from about 0.1 μm to about 1 μm is formed on dielectric layers 24 and 206 and on aluminum layer 222. A layer of nitride 223 is formed on titanium layer 221 and a layer of nitride 229 is formed on the titanium layer 227. A layer of silver 225 is formed on nitride layer 223 and a layer of silver 231 is formed on nitride layer 229. Titanium layers 221 and 227, nitride layers 223 and 229, and silver layers 225 and 231 may be formed by evaporation or other techniques known to those skilled in the art. The layers of titanium, nitride, and silver are patterned so that a portion 224 over aluminum layer 220 remains and portion 226 over aluminum layer 222 remains. Portions 224 and 226 are also referred to as contact structures. An advantage of transient voltage suppressor 10 is that it includes a higher gate dopant concentration in the Zener region and a lighter gate dopant concentration in the non-Zener regions, i.e., the remaining device active region, which produces a uniform device in terms of turn-on propagaton and holding current levels without degrading the surge performance. In addition, the selective introduction of a higher dopant concentration in the Zener region results in a lower device capacitance because transient voltage suppressor 10 can be manufactured on a smaller die. The lower capacitance, in turn, results in a lower insertion loss.

Figure 14:
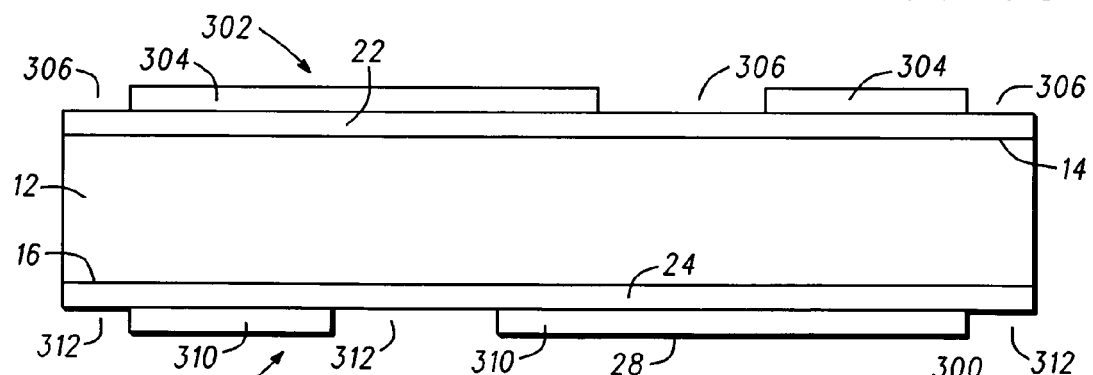
FIG. 14 is a cross-sectional view of a semiconductor component at an early stage of manufacture in accordance with another embodiment of the present invention.

FIG. 14 is a cross-sectional view of a portion of a transient voltage suppressor device 300 at an early stage of manufacture in accordance with another embodiment of the present invention. Transient voltage suppressor devices are also referred to as transient surge protection devices. Examples of transient voltage suppressor devices include thyristors, silicon controlled rectifiers (SCRs), triacs, sidacs, diacs, or the like. What is shown in FIG. 14 is a semiconductor substrate 12 having surfaces 14 and 16. A layer of dielectric material 22 is formed on surface 14 and a layer of dielectric material 24 is formed on surface 16. Semiconductor substrate 12 and dielectric layers 22 and 24 have been described with reference to FIG. 1. A layer of photoresist is formed on surface 26 of dielectric layer 22 and a layer of photoresist is formed on surface 28 of dielectric layer 24 using techniques known to those skilled in the art. The photoresist layer on surface 26 is patterned to form an etch mask 302 having masking features 304 and openings 306 and the photoresist layer on surface 28 is patterned to form an etch mask 308 having masking features 310 and openings 312. Openings 306 expose portions of dielectric layer 22 and openings 312 expose portions of dielectric layer 24. Etch masks 302 and 308 may also be referred to as anode photomasks.

Figure 15:
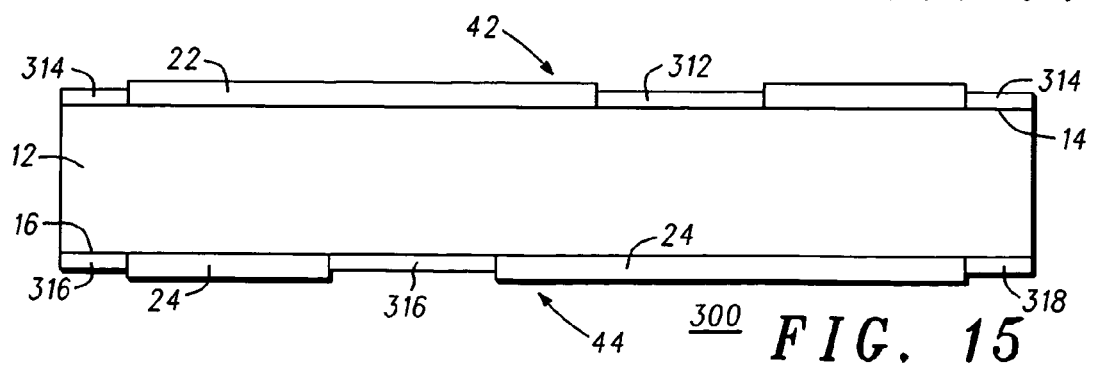
FIG. 15 is a cross-sectional view of the semiconductor component of FIG. 14 at a later stage of manufacture.

Referring now to FIG. 15, the exposed portions of dielectric layers 22 and 24 are anisotropically etched using either a dry etch or a wet etch to expose portions of surfaces 14 and 16. By way of example, the exposed portions of dielectric layers 22 and 24 are etched using hydrofluoric (HF) acid. Etch masks 302 and 308 are removed and the remaining portions of dielectric layers 22 and 24 serve as doping masks or diffusion masks. Although portions 42 and 44 of dielectric layers 22 and 24, respectively, overlap, this is not a limitation of the present invention. In addition, the amount of overlap of portions 42 and 44 is not a limitation of the present invention.

An impurity material of P type conductivity is deposited on the exposed portions of surfaces 14 and 16 of semiconductor substrate 12 to form predeposition layers 312 and 314 on surface 14 and predeposition layers 316 and 318 on surface 16. In a subsequent step, the impurity materials of predeposition layers 312, 314, 316, and 318 are driven into semiconductor substrate 12 to form deep anode regions and isolation regions. Thus, predeposition layers 312, 314, 316, and 318 are also referred to as anode/isolation predeposition layers or pre-anode layers. By way of example, the impurity material is boron and is deposited to have a resistivity ranging from about 2 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming predeposition layers 312, 314, 316, and 318, surfaces 26 and 28 and the exposed portions of surfaces 14 and 16 are cleaned using, for example, dilute hydrofluoric acid. It should be noted that layers 312 and 316 are predeposition layers for anodes of transient voltage suppressor device 300 and layers 314 and 318 are predeposition layers for isolation structures of transient voltage suppressor device 300.

Figure 16:
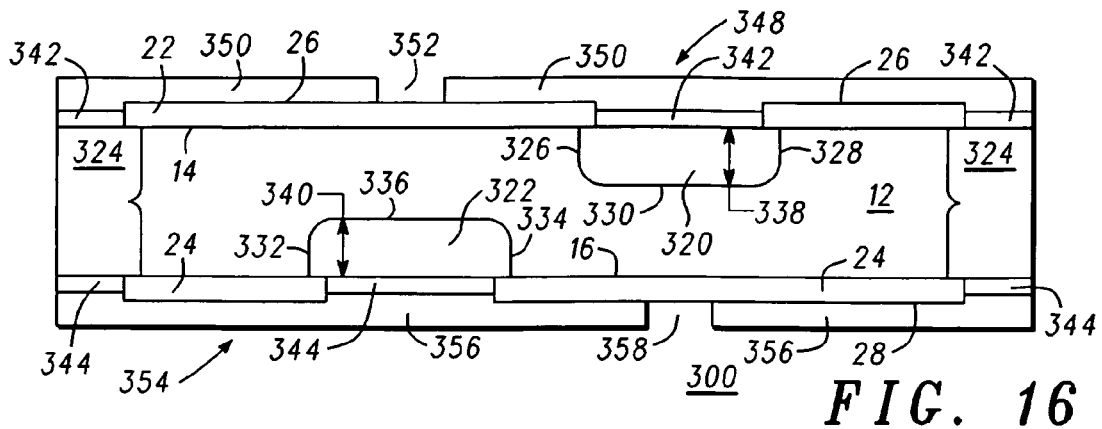
FIG. 16 is a cross-sectional view of the semiconductor component of FIG. 15 at a later stage of manufacture.

Referring now to FIG. 16, the impurity material of predeposition layers 312, 314, 316, and 318 is driven into semiconductor substrate 12 to form doped regions 320 and 322 and isolation structures 324. The drive-in is performed for a time ranging from about 20 hours to about 225 hours at a temperature ranging from about 1,250° C. to about 1,280° C. Doped region 320 extends from surface 14 into semiconductor substrate 12, has lateral boundaries 326 and 328, a vertical boundary 330, and serves as an anode region of transient voltage suppressor device 300. Doped region 322 extends from surface 16 into semiconductor substrate 12, has lateral boundaries 332 and 334, a vertical boundary 336, and serves as another anode region of transient voltage suppressor device 300. The distance from surface 14 to vertical boundary 330 represents a junction depth 338 and the distance from surface 16 to vertical boundary 336 represents a junction depth 340. Driving in predeposition layers 312 and 316, i.e., forming doped regions 320 and 322, and predeposition layers 314 and 318, i.e., forming isolation regions 324, oxidizes the exposed portions of surfaces 14 and 16 thereby forming oxide or dielectric layers 342 and 344. Preferably, the thicknesses of oxide layers 342 and 344 is less than about 10,000 Å and even more preferably is about 8,000 Å.

A layer of photoresist is formed on surface 26 of dielectric layer 22 and on dielectric layer 342 and a layer of photoresist is formed on surface 28 of dielectric layer 24 and on dielectric layer 344 using techniques known to those skilled in the art. The photoresist layer on surface 26 and oxide layer 342 is patterned to form an etch mask 348 having masking features 350 and an opening 352 and the photoresist layer on surface 28 and oxide layer 344 is patterned to form an etch mask 354 having masking features 356 and an opening 358. Opening 352 exposes a portion of dielectric layer 22 and opening 358 exposes a portion of dielectric layer 24. Although openings 352 and 358 are shown as being laterally centered within doped regions 320 and 322, respectively, this is not a limitation of the present invention. In other words, openings 352 and 358 may be laterally asymmetric with respect to doped regions 320 and 322. Etch masks 348 and 354 are also referred to as Zener zone etch masks or Zener zone masking structures.

Figure 17:
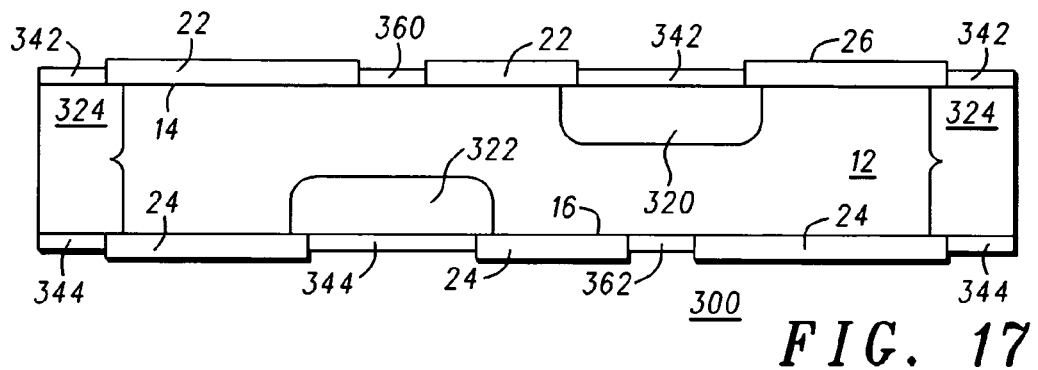
FIG. 17 is a cross-sectional view of the semiconductor component of FIG. 16 at a later stage of manufacture.

Referring now to FIG. 17, the exposed portions of dielectric layers 22 and 24 are anisotropically etched using either a dry etch or a wet etch to expose portions of surfaces 14 and 16. By way of example, the exposed portions of dielectric layers 22 and 24 are etched using hydrofluoric (HF) acid. An impurity material of N-type conductivity is deposited on the exposed portions of surfaces 14 and 16 to form predeposition layers 360 and 362, respectively. Predeposition layers 360 and 362 are also referred to as Zener Zone predeposition layers because they form Zener zones during a subsequent drive-in step. By way of example, the impurity material is phosphorus or a phosphorus containing material that is deposited to have a resistivity ranging from about 100 Ω/square to about 1,000 Ω/square. Suitable sources of phosphorus include phosphorus oxytrichloride ($POCl_3$), phosphine ($PH_3$), phosphorus pentaoxide, or the like. In accordance with one embodiment, the phosphorus is disposed on surfaces 14 and 16 by ion implantation. Zener zone etch masks 348 and 354 are removed.

Figure 18:
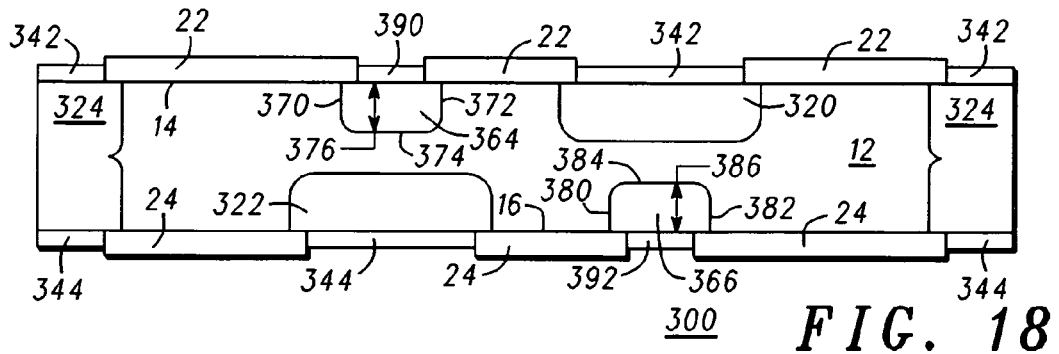
FIG. 18 is a cross-sectional view of the semiconductor component of FIG. 17 at a later stage of manufacture.

Referring now to FIG. 18, the impurity material of predeposition layers 360 and 362 is driven into semiconductor substrate 12 to form doped regions 364 and 366. The drive-in is performed for a time ranging from about 1 hour to approximately 20 hours at a temperature ranging from about 1,250° C. to about 1,280° C. Doped region 364 extends from surface 14 into semiconductor substrate 12, has lateral boundaries 370 and 372, a vertical boundary 374, and serves as a Zener zone or Zener region of transient voltage suppressor device 300. Doped region 366 extends from surface 16 into semiconductor substrate 12, has lateral boundaries 380 and 382, a vertical boundary 384, and serves as another Zener zone or Zener region of transient voltage suppressor device 300. The distance from surface 14 to vertical boundary 374 represents a diffusion depth 376 and the distance from surface 16 to vertical boundary 384 represents a diffusion depth 386. Driving-in predeposition layers 360 and 362, i.e., forming doped regions 364 and 366, oxidizes the exposed portions of surfaces 14 and 16 thereby forming oxide or dielectric layers 390 and 392, respectively. It should be noted that oxide layers 390 and 392 are formed in a dry ambient, thus their thicknesses are less than about 5,000 Å. Oxide layers 390 and 392 are thinner than oxide layers 342 and 344. As those skilled in the art are aware, oxidizing a semiconductor material such as silicon consumes portions of the silicon. Accordingly, oxide layers 390 and 392 extend below surfaces 14 and 16, respectively.

Figure 19:
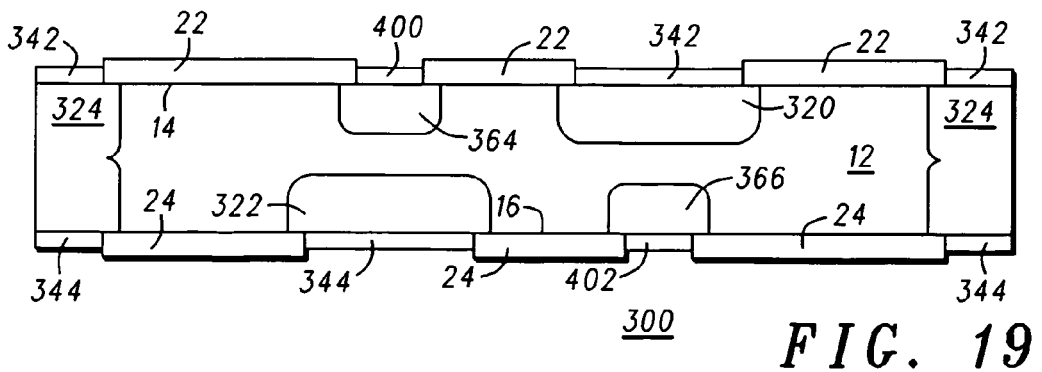
FIG. 19 is a cross-sectional view of the semiconductor component of FIG. 18 at a later stage of manufacture.

Referring now to FIG. 19, dielectric layers 390 and 392 are anisotropically etched using either a dry etch or a wet etch to expose portions of surfaces 14 and 16. By way of example, the dielectric layers 390 and 392 are etched using hydrofluoric (HF) acid. Because dielectric layers 390 and 392 extend below surfaces 12 and 14, their removal leaves notches 394 and 396 in the exposed portions of substrate 12. The etch that removes dielectric layers 390 and 392 also removes portions of dielectric layers 22, 24, 342, and 344. However, dielectric layers 22, 24, 342, and 344 remain over substrate 12 because they are thicker than dielectric layers 390 and 392. An advantage of the difference in thicknesses between dielectric layers 390 and 392 and dielectric layers 22, 24, 342, and 344 is that dielectric layers 390 and 392 can be removed to open or expose portions of substrate 12 without using an additional masking layer to protect dielectric layers 22, 24, 342, and 344.

An impurity material of P type conductivity is deposited on the exposed portions of surfaces 14 and 16 of semiconductor substrate 12 to form predeposition layers. By way of example, the impurity material is boron and is deposited to have a resistivity ranging from about 10 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming the predeposition layers, surfaces 26 and 28, the exposed portions of surfaces 14 and 16, and the surfaces of dielectric layers 342 and 344 are cleaned using, for example, dilute hydrofluoric acid. Cleaning these surfaces removes the portions of the predeposition layers from surfaces 26 and 28 and from the surfaces of the dielectric layers 342 and 344, leaving predeposition layers 400 and 402. Predeposition layer 400 and 402 are also referred to as gate predeposition layers or first gate predeposition layers because another set of gate predeposition layers is formed in a subsequent step. The impurity material of gate predeposition layers 400 and 402 adjusts the gain of the bipolar transistor formed in the Zener zone.

Figure 20:
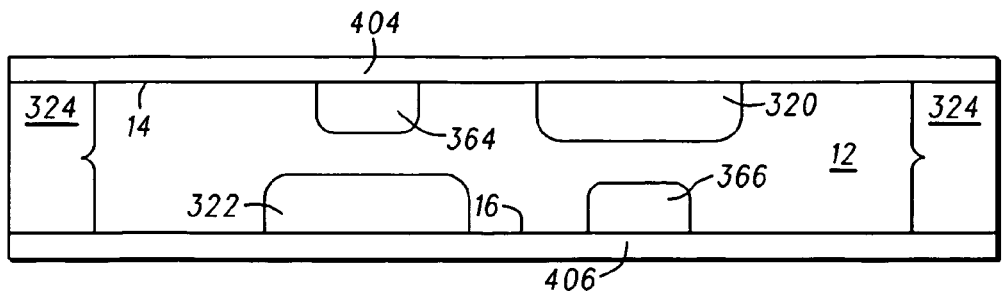
FIG. 20 is a cross-sectional view of the semiconductor component of FIG. 19 at a later stage of manufacture.

Referring now to FIG. 20, dielectric layers 22 and 342 are removed from surface 14 and dielectric layers 24 and 344 are removed from surface 16. Techniques for removing dielectric materials such as the dielectric material of dielectric layers 22, 24, 342, and 344 are known to those skilled in the art. An impurity material of P type conductivity is deposited on the exposed portions of surfaces 14 and 16 of semiconductor substrate 12 to form predeposition layers 404 and 406. By way of example, the impurity material is boron and is deposited to have a resistivity ranging from about 10 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. Predeposition layers 404 and 406 are also referred to as gate predeposition layers or second gate predeposition layers. Second gate predeposition layers 404 and 406 increase the dopant concentrations first gate predeposition layers 400 and 402, respectively. For the sake of clarity, first gate predeposition layers 400 and 402 and second gate predeposition layers 404 and 406 are collectively referred to as gate predeposition layers 404 and 406. However, it should be noted that formation of first gate predeposition layers 400 and 402 selectively increases the gate dopant concentration in the Zener region compared to the non-Zener regions, i.e., the remaining device active regions. In other words, including gate predeposition layers 400 and 402 results in the selective introduction of a higher gate dose in the previously created Zener region and a lighter gate dose in the remaining active device regions.

Referring now to FIG. 20, the impurity material of predeposition layers 404 and 406 is driven into semiconductor substrate 12 to form doped regions 420 and 422. The drive-in is performed for a time ranging from about 1 hour to about 20 hours at a temperature ranging from about 1,250° C. to about 1,280° C. Doped region 420 extends from surface 14 into semiconductor substrate 12 and has a vertical boundary 424. Doped region 422 extends from surface 16 into semiconductor substrate 12 and has a vertical boundary 426. The distance from surface 14 to vertical boundary 424 represents a diffusion depth 428 and the distance from surface 16 to vertical boundary 426 represents as a diffusion depth 430. Driving in predeposition layers 404 and 406, i.e., forming doped regions 420 and 424, oxidizes the exposed portions of surfaces 14 and 16 thereby forming oxide or dielectric layers 432 and 434, respectively. By way of example, dielectric layers 432 and 434 are oxide layers 432 and 434 that have thicknesses ranging from about 5,000 Å to about 25,000 Å. The duration of the drive-in is selected to set the desired voltage protection range.

Figure 21:
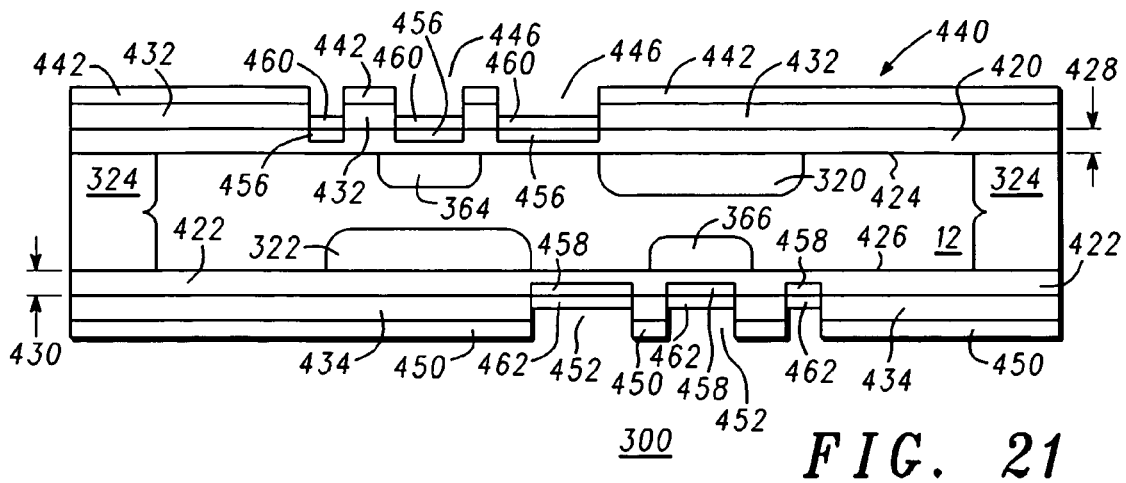
FIG. 21 is a cross-sectional view of the semiconductor component of FIG. 20 at a later stage of manufacture.

Referring now to FIG. 21, a layer of photoresist is formed on dielectric layer 432 and a layer of photoresist is formed dielectric layer 434 using techniques known to those skilled in the art. The photoresist layer on dielectric layer 432 is patterned to form an etch mask 440 having masking features 442 and openings 446 and the photoresist layer on dielectric layer 434 is patterned to form an etch mask 448 having masking features 450 and openings 452. Openings 446 expose portions of dielectric layer 432 that are laterally adjacent to regions 320 and 364 and openings 446 expose portions of dielectric layer 434 laterally adjacent to doped regions 322 and 366.

Still referring to FIG. 21, the exposed portions of dielectric layers 432 and 434 are anisotropically etched using either a dry etch or a wet etch to expose portions of doped regions 420 and 422. By way of example, the exposed portions of dielectric layers 432 and 434 are etched using hydrofluoric (HF) acid. Etch masks 440 and 448 are removed. An impurity material of N-type conductivity is deposited on the exposed portions of doped regions 420 and 422 to form predeposition layers 456 and 458, respectively. Predeposition layers 456 and 458 are also referred to as cathode predeposition layers. By way of example, the impurity material is phosphorus or a phosphorus containing material that is deposited to have a resistivity ranging from about 0.25 Ω/square to about 10 Ω/square. Suitable sources of phosphorus include phosphorus oxytrichloride ($POCl_3$), phosphine ($PH_3$), phosphorus pentaoxide, or the like. The phosphorus can be disposed on doped regions 420 and 422 by ion implantation. Etch masks 440 and 448 are also referred to as cathode etch masks, cathode masking structures, or cathode etch masking structures.

Dielectric layers 460 and 462 having thicknesses ranging from about 500 Å to about 10,000 Å are formed from the exposed portions of doped regions 420 and 422 that have predeposition layers 456 and 458, respectively. By way of dielectric layers 460 and 462 are oxide formed in a dry ambient at a temperature ranging from about 970° C. to about 1,200° C. for a time ranging from about one minute to about one hundred minutes.

Figure 22:
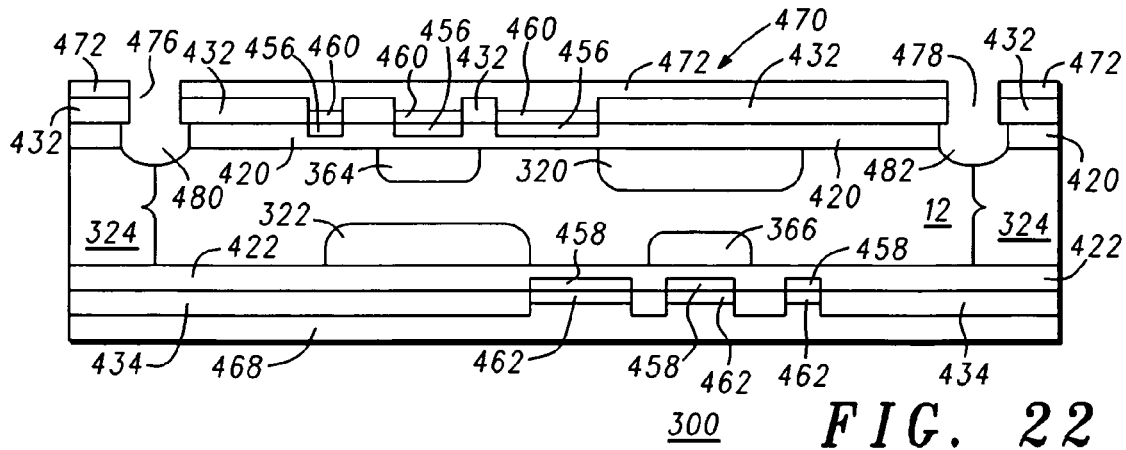
FIG. 22 is a cross-sectional view of the semiconductor component of FIG. 21 at a later stage of manufacture.

Referring now to FIG. 22, a layer of photoresist is formed on dielectric layers 432 and 460 and a layer of photoresist 468 is formed dielectric layers 434 and 462 using techniques known to those skilled in the art. The photoresist layer on dielectric layer 432 is patterned to form an etch mask 470 having masking features 472 and openings 476 and 478. Opening 476 exposes a portion of dielectric layer 432 laterally adjacent to isolation structure 324 and laterally adjacent to doped region 364 and opening 478 exposes a portion of dielectric layer 432 laterally adjacent to isolation structure 324 and doped region 320.

The exposed portions of dielectric layer 432 are etched using either a dry etch or a wet etch to expose portions of substrate 12 and isolation structures 324. By way of example, the exposed portions of dielectric layer 432 are etched using hydrofluoric (HF) acid. Preferably, the etch forms moat structures 480 and 482 that extend from surface 14 into substrate 12 a distance ranging from about 30 μm to about 70 μm. Although mote structures 480 and 482 expose portions of isolation structures 324, this is not a limitation of the present invention.

Figure 23:
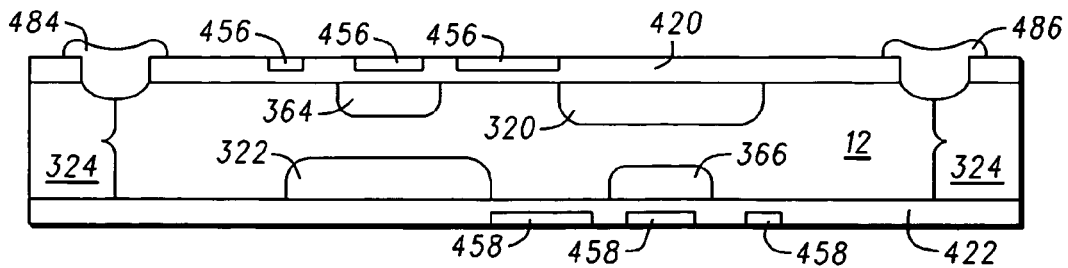
FIG. 23 is a cross-sectional view of the semiconductor component of FIG. 22 at a later stage of manufacture.

Referring now to FIG. 23, etch mask 470, photoresist layer 468, and dielectric layers 432, 460, 434, and 462 are stripped from surfaces 14 and 16 using techniques known to those skilled in the art. A layer of photoglass (not shown) is formed on the exposed surface 14 and fills moat structures 480 and 482. The layer of photoglass is patterned using a photolithographic process leaving dielectric plugs 484 and 486 in moat structures 480 and 482, respectively.

Figure 24:
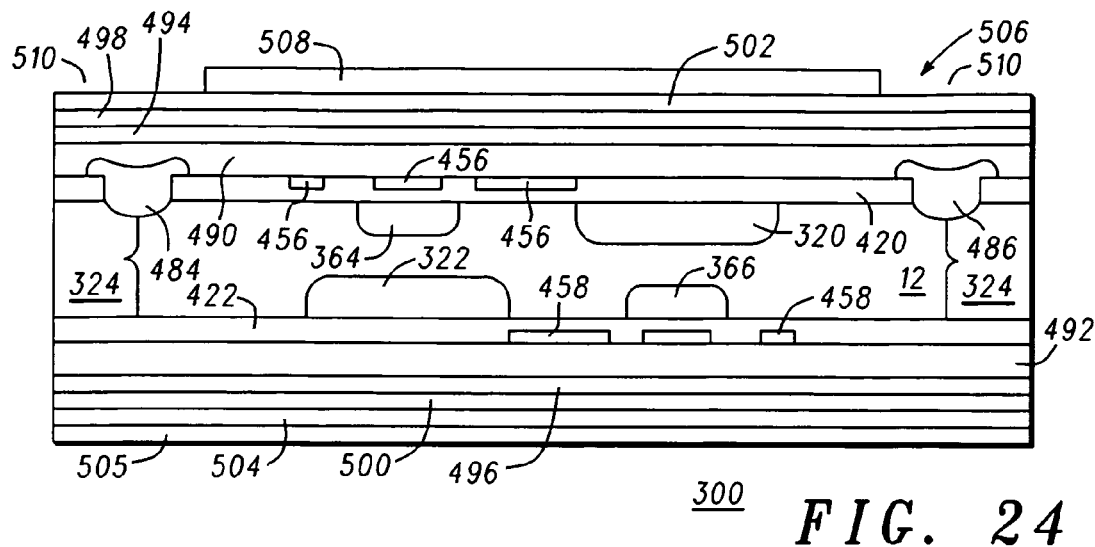
FIG. 24 is a cross-sectional view of the semiconductor component of FIG. 23 at a later stage of manufacture.

Referring now to FIG. 24, a layer of aluminum 490 having a thickness ranging from about one μm to about twenty μm is formed on doped region 420, predeposition layers 456, and moat structures 480 and 482 and a layer of aluminum 492 having a thickness ranging from about one μm to about twenty μm is formed on doped region 422 and predeposition layers 458. Aluminum layers 490 and 492 may be formed by evaporation or other techniques known to those skilled in the art. A layer of titanium 494 having a thickness ranging from about 0.1 μm to about 1 μm is formed on aluminum layer 490 and a layer of titanium 496 having a thickness ranging from about 0.1 μm to about 1 μm is formed on aluminum layer 492. A layer of nitride 498 is formed on titanium layer 494 and a layer of nitride 500 is formed on titanium layer 496. A layer of silver 502 is formed on nitride layer 498 and a layer of silver 504 is formed on nitride layer 500. Titanium layers 494 and 496, nitride layers 498 and 500, and silver layers 502 and 504 may be formed by evaporation or other techniques known to those skilled in the art.

Still referring to FIG. 24, a layer of photoresist is formed on silver layer 502 and a layer of photoresist 505 is formed on silver layer 504. The photoresist layer on silver layer 504 is patterned to form an etch mask 506 having masking features 508 and openings 510. Etch mask 506 remains over doped regions 320 and 364 to protect the portions of aluminum layer 490, titanium layer 494, nitride layer 498 and silver layer 502 over doped regions 320 and 364.

Figure 25:
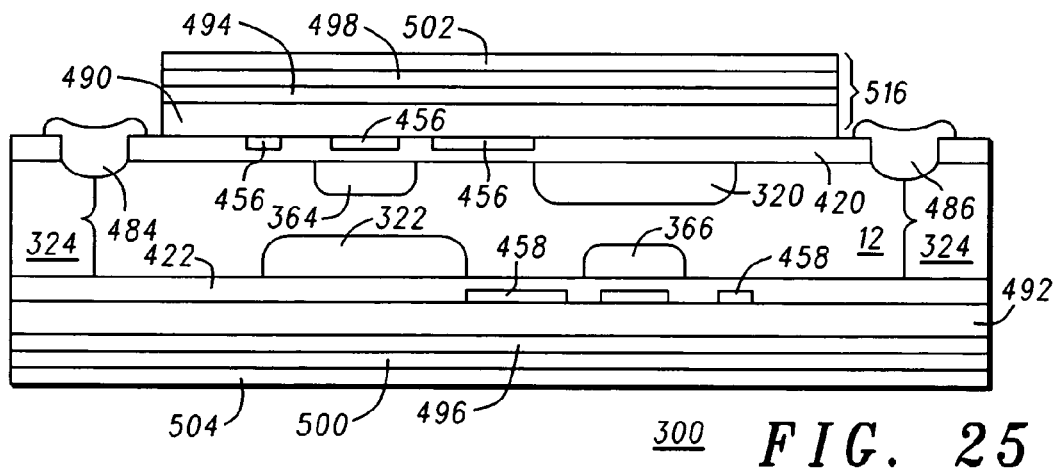
FIG. 25 is a cross-sectional view of the semiconductor component of FIG. 24 at a later stage of manufacture.

Referring now to FIG. 25, the exposed portions of silver layer 504 and the portions of aluminum layer 490, titanium layer 494, nitride layer 498 below the exposed portions of silver layer 504 are removed using, for example, a reactive ion etch. The remaining portions of aluminum layer 490, titanium layer 494, nitride layer 498 and silver layer 502 form a contact 516. Like transient voltage suppressor 10, an advantage of transient voltage suppressor 300 is that it includes a higher gate dopant concentration in the Zener region and a lighter gate dopant concentration in the non-Zener regions, i.e., the remaining device active region, which produces a uniform device in terms of turn-on propagaton and holding current levels without degrading the surge performance. In addition, the selective introduction of a higher dopant concentration in the Zener region results in a lower device capacitance because transient voltage suppressor 10 can be manufactured on a smaller die. The lower capacitance, in turn, results in a lower insertion loss.

Figure 26:
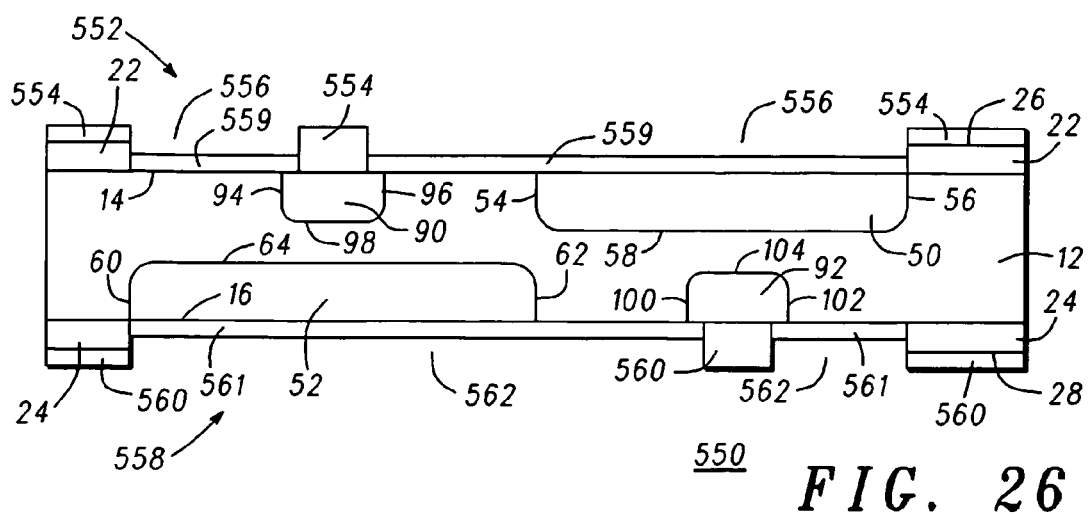
FIG. 26 is a cross-sectional view of a semiconductor component at an early stage of manufacture in accordance with another embodiment of the present invention.

FIG. 26 is a cross-sectional view of a portion of a transient voltage suppressor device 550 at an early stage of manufacture in accordance with another embodiment of the present invention. The beginning steps for manufacturing transient voltage suppressor device 550 may be the similar to those described with reference to FIGS. 1-6 for transient voltage suppressor device 10. Thus, the description of FIG. 26 continues from the description of FIG. 5. What is shown in FIG. 26 are etch masks 552 and 558 formed over dielectric layers 22 and 24, respectively. More particularly, a layer of photoresist is formed on dielectric layer 110, dielectric layer 22, and dielectric layer 70 and a layer of photoresist is formed on dielectric layer 112, dielectric layer 24, and dielectric layer 72 using techniques known to those skilled in the art. The photoresist layer on dielectric layers 22, 70 and 110 is patterned to form etch masks (not shown) that expose portions of dielectric layers 22, 70 and 110 and semiconductor substrate 12. The photoresist layer on dielectric layers 24, 72 and 112 is patterned to form etch masks (not shown) that expose portions of dielectric layers 24, 72 and 112 and semiconductor substrate 12. The exposed portions of dielectric layer 22, 24, 70, 72, 110, and 112 are removed using for example a reactive ion etch to expose Zener regions 90 and 92 and anode regions 50 and 52.

Still referring to FIG. 26, a layer of photoresist is formed on Zener region 90, anode region 50, and the remaining portions of dielectric layer 22 and a layer of photoresist is formed on Zener region 92, anode region 52, and the remaining portions of dielectric layer 24. The photoresist layer on Zener region 90, anode region 50, and the remaining portions of dielectric layer 22 is patterned to form an etch mask 552 having masking features 554 and openings 556. The photoresist layer on Zener region 92, anode region 52, and the remaining portions of dielectric layer 22 is patterned to form an etch mask 558 having masking features 560 and an opening 562. Openings 556 expose a portion of Zener region 90, anode region 50, and portions of substrate 12 adjacent to Zener region 50 and anode region 90 and opening 562 exposes Zener region 92, anode region 52, and portions of substrate 12 adjacent to Zener region 92 and anode region 52.

An impurity material of P type conductivity is deposited on the portions of surfaces 14 and 16 exposed by openings 556 and 562, respectively, to form predeposition layers. By way of example, the impurity material is boron and is deposited to have a resistivity ranging from about 10 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming the predeposition layers, etch masks 552 and 558 are removed and the remaining portions of surfaces 26 and 28 are cleaned using, for example, dilute hydrofluoric acid. Cleaning these surfaces removes the portions of the predeposition layers from surfaces 26 and 28, leaving predeposition layers 559 and 561. Predeposition layers 559 and 561 are also referred to as gate predeposition layers. It should be noted that gate mask 554 blocks the formation of a predeposition layer within Zener region 90 and that gate mask 560 blocks the formation of a predeposition layer within Zener region 92. The absence of the predeposition layer within Zener regions 90 and 92 helps form localized breakdown voltage regions.

Figure 27:
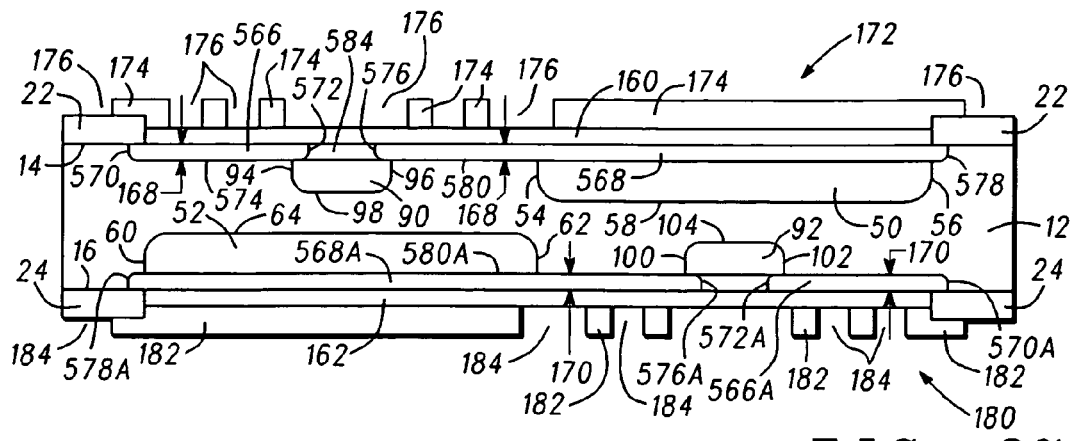
FIG. 27 is a cross-sectional view of the semiconductor component of FIG. 26 at a later stage of manufacture.

Referring now to FIG. 27, the impurity material of predeposition layers 559 and 561 is driven into semiconductor substrate 12 to form doped regions 566, 568, 566A, and 568A. The drive-in is performed for a time ranging from about 1 hour to about 20 hours at a temperature ranging from about 1,250° C. to about 1,280° C. Doped region 566 extends from surface 14 into semiconductor substrate 12, has lateral boundaries 570 and 572, a vertical boundary 574. Doped region 568 extends from surface 14 into semiconductor substrate 12, has lateral boundaries 576 and 578 and a vertical boundary 580. Doped region 566A extends from surface 14 into semiconductor substrate 12, has lateral boundaries 570A and 572A, a vertical boundary 574A. Doped region 568A extends from surface 14 into semiconductor substrate 12, has lateral boundaries 576A and 578A and a vertical boundary 580A. The distance from surface 14 to vertical boundary 580 represents a diffusion depth 168 and the distance from surface 16 to vertical boundary 580A represents a diffusion depth 170. Because a portion of masking structure 554 is over Zener region 90, the concentration of P-type impurity material between Zener region 90 and dielectric layer 160 is lower than the concentration of P-type impurity material or dopant in doped regions 566 and 568. The region vertically bounded by substrate 12 and Zener region 90 and laterally bounded by boundaries 572 and 576 of doped regions 566 and 568, respectively, is referred to as a localized breakdown region. Because a portion of masking structure 560 is over Zener region 92, the concentration of P-type impurity material between Zener region 92 and dielectric layer 162 is lower than the concentration of P-type impurity material or dopant in doped regions 566A and 568A. The region vertically bounded by substrate 12 and Zener region 92 and laterally bounded by boundaries 572A and 576A of doped regions 566A and 568A, respectively, is referred to as a localized breakdown region. Driving-in predeposition layers 559 and 561, i.e., forming doped regions 566, 568, 566A, and 568A, oxidizes the exposed portions of surfaces 14 and 16 thereby forming oxide or dielectric layers 160 and 162, respectively. Oxide layers 160 and 162 have thicknesses ranging from about 5,000 Å to about 25,000 Å. As those skilled in the art are aware, oxidizing a semiconductor material such as silicon consumes portions of the silicon. Thus, oxide layers 160 and 162 extend below surfaces 14 and 16, respectively. Distance 166 between oxide layer 162 and doped region 92 is a diffusion depth that preferably ranges from about 15 micrometers (μm) to about 20 μm. The distances 168 and 170 between oxide layer 160 and vertical boundary 580 and between oxide layer 162 and vertical boundary 580A are diffusion depths that preferably range from about 25 micrometers (μm) to about 30 μm.

A layer of photoresist is formed on dielectric layer 22 and dielectric layer 160 and a layer of photoresist is formed dielectric layer 24 and dielectric layer 162 using techniques known to those skilled in the art. The photoresist layer on dielectric layers 22 and 160 is patterned to form an etch mask 172 having masking features 174 and openings 176 and the photoresist layer on dielectric layers 24 and 162 is patterned to form an etch mask 180 having masking features 182 and openings 184. Openings 176 expose portions of dielectric layers 22 and 160 laterally adjacent to doped regions 50 and 90 and openings 184 expose portions of dielectric layers 24 and 162 laterally adjacent to doped regions 52 and 92. Etch masks 172 and 180 are referred to as cathode etch masks or cathode masking structures.

Figure 28:
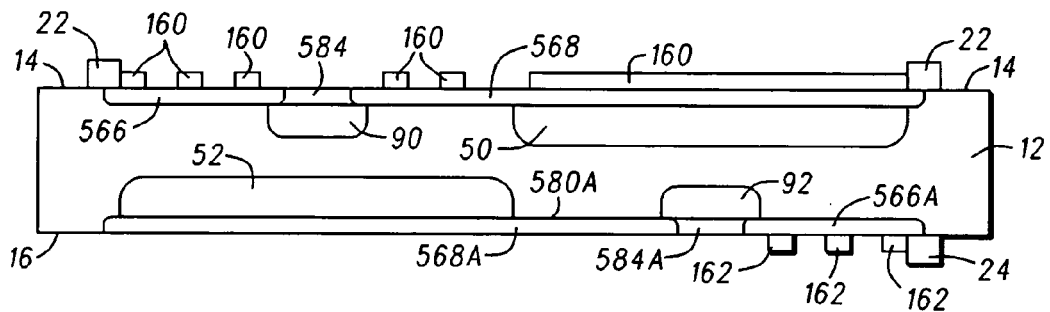
FIG. 28 is a cross-sectional view of the semiconductor component of FIG. 27 at a later stage of manufacture.

Referring now to FIG. 28, the exposed portions of dielectric layers 22, 24, 160, and 162 are anisotropically etched using either a dry etch or a wet etch to expose portions of doped regions 566, 568, and 144 and to expose breakdown regions 584 and 584A. By way of example, the exposed portions of dielectric layers 22, 24, 160, and 162 are etched using hydrofluoric (HF) acid. Cathode etch masks 172 and 180 are removed.

Figure 29:
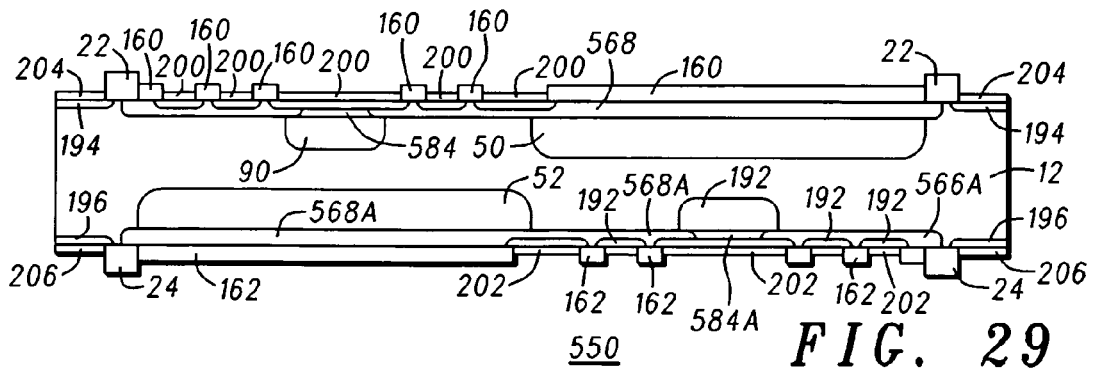
FIG. 29 is a cross-sectional view of the semiconductor component of FIG. 28 at a later stage of manufacture.

Referring now to FIG. 29, an impurity material of N-type conductivity is deposited on the exposed portions of doped regions 566, 568, 566A, and 568A to form predeposition layers 190 and 192, respectively. Predeposition layers 190 and 192 are referred to as cathode predeposition layers. The impurity material of N-type conductivity is also deposited on the exposed portions of surfaces 14 and 16 to form predeposition layers 194 and 196, respectively. By way of example, the impurity material is phosphorus or a phosphorus containing material that is deposited to have a resistivity ranging from about 0.25 Ω/square to about 10 Ω/square. Suitable sources of phosphorus include phosphorus oxytrichloride ($POCl_3$), phosphine ($PH_3$), phosphorus pentaoxide, or the like. The phosphorus can be disposed on doped regions 142 and 144 and the exposed portions of surfaces 14 and 16 by ion implantation.

An oxide layer 200 having thicknesses ranging from about 500 Å to about 10,000 Å is formed from the exposed portions of doped regions 566, 568, and breakdown region 584 that have predeposition layer 190 and an oxide layer 202 having a thickness ranging from about 500 Å to about 10,000 Å is formed from the exposed portion of doped regions 566A, 568A, and breakdown region 584A that has predeposition layers 192. In addition, oxide layers 204 and 206 having thicknesses ranging from about 500 Å to about 10,000 Å are formed from the exposed portions of substrate 12. By way of example, oxide layers 200, 202, 204, and 206 are formed in a dry ambient at a temperature ranging from about 970° C. to about 1,200° C. for a time ranging from about one minute to about one hundred minutes.

Figure 30:
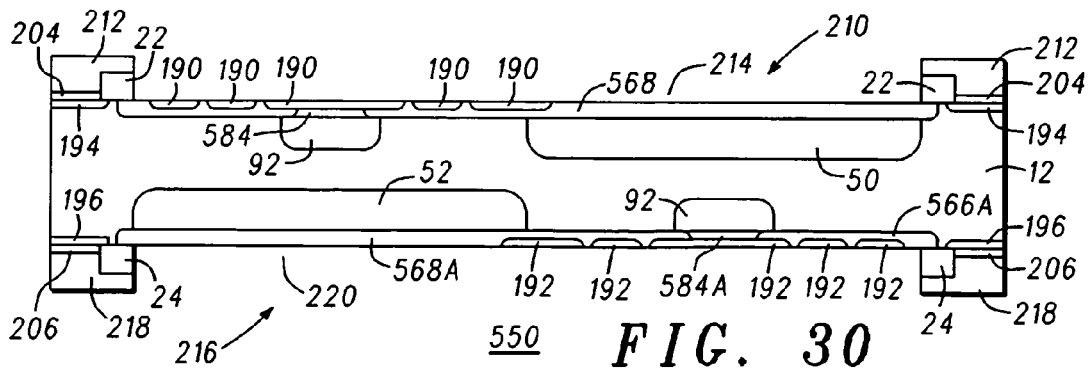
FIG. 30 is a cross-sectional view of the semiconductor component of FIG. 29 at a later stage of manufacture.

Referring now to FIG. 30, a layer of photoresist is formed on dielectric layers 22, 160, 200, and 204 and a layer of photoresist is formed on dielectric layers 24, 162, 202, and 206 using techniques known to those skilled in the art. The photoresist layer on dielectric layers 22, 160, 200, and 204 is patterned to form an etch mask 210 having masking features 212 and an opening 214 and the photoresist layer on dielectric layers 24, 162, 202, and 206 is patterned to form an etch mask 216 having masking features 218 and an opening 220. Etch masks 210 and 216 are referred to as pre-Ohmic etch masks or pre-Ohmic masking structures. Opening 214 exposes portions dielectric layers 160 and 200 and opening 220 exposes dielectric layers 162 and 202. Dielectric layers 160, 200, 162, and 202 are anisotropically etched using either a dry etch or a wet etch to expose doped regions 566, 568, 566A, and 568A and predeposition layers 190 and 192. By way of example, the dielectric layers 160, 200, 162, and 202 are etched using hydrofluoric (HF) acid. Pre-Ohmic etch masks 210 and 216 are removed.

Alternatively, passivating layers such as, for example, SIPOS, nitride, oxide, or the like may be formed on dielectric layers 22, 24, 160, 162, 200, 202, 204, and 206 rather than forming etch masks 210 and 216. The passivating layers are then patterned to expose dielectric layers 160, 162, 200, and 202.

Figure 31:
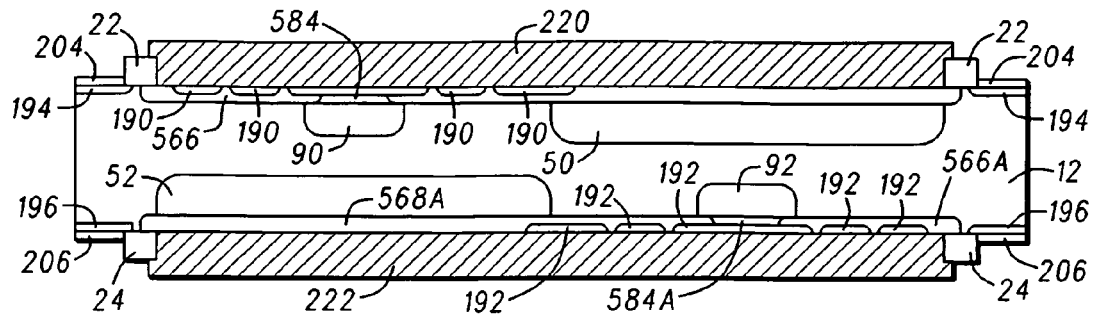
FIG. 31 is a cross-sectional view of the semiconductor component of FIG. 30 at a later stage of manufacture.

Referring now to FIG. 31, a layer of aluminum having a thickness ranging from about one µm to about twenty µm is formed on dielectric layers 22 and 204 and on the exposed portions of doped regions 566 and 568, the exposed portion of breakdown region 584, and on predeposition layers 190 and a layer of aluminum having a thickness ranging from about one µm to about twenty µm is formed on dielectric layers 24 and 206 and on the exposed portions of doped regions 566A and 568A, the exposed portion of breakdown region 584A, and on predeposition layers 192. The aluminum layers may be formed by evaporation or other techniques known to those skilled in the art. The layers of aluminum are patterned so that a portion 220 over doped region 142 and predeposition layers 190 and a portion 222 over doped region 144 and predeposition layer 192 remain. Portion 220 is also referred to as an aluminum layer and portion 222 is also referred to as an aluminum layer.

Figure 32:
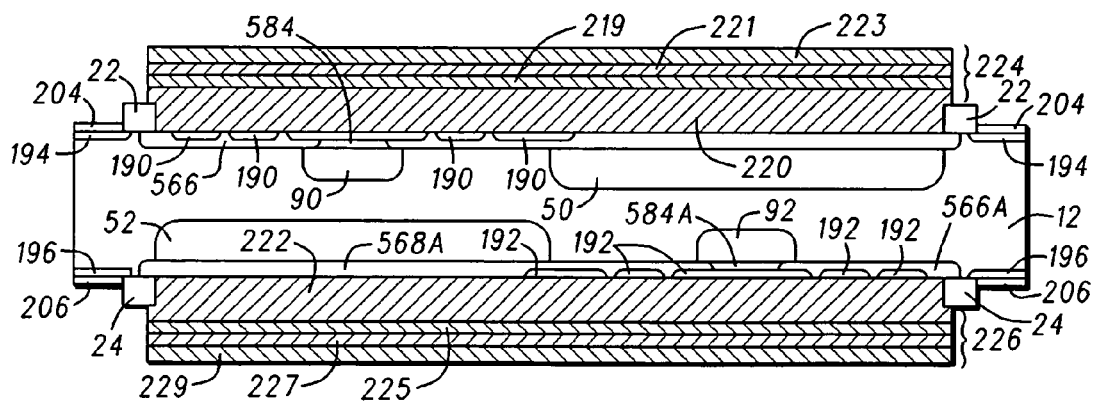
FIG. 32 is a cross-sectional view of the semiconductor component of FIG. 31 at a later stage of manufacture.

Referring now to FIG. 32, a layer of titanium 219 having a thickness ranging from about 0.1 µm to about 1 µm is formed on the dielectric layers 22 and 204 and on aluminum layer 220 and a layer of titanium 225 having a thickness ranging from about 0.1 µm to about 1 µm is formed on dielectric layers 24 and 206 and on aluminum layer 222. A layer of nitride 221 is formed on titanium layer 219 and a layer of nitride 227 is formed on titanium layer 225. A layer of silver 223 is formed on nitride layer 221 and a layer of silver 229 is formed on nitride layer 227. Titanium layers 219 and 225, nitride layers 221 and 227, and silver layers 223 and 229 may be formed by evaporation or other techniques known to those skilled in the art. Titanium layers 219 and 225, nitride layers 221 and 227, and silver layers 223 and 229 are patterned so that a portion 224 over aluminum layer 220 remains and portion 226 over aluminum layer 222 remains. Portions 224 and 226 are also referred to as contact structures. An advantage of transient voltage suppressor 550 is that it includes a lower gate dopant concentration in the Zener region and a heavier gate dopant concentration in the non-Zener regions, i.e., the remaining device active region, which serve as triggers for fast turn on. In addition, the selective introduction of lower gate doping can be distributed to enhance the turn on speed. The low carrier concentration regions with high gain can be distributed to provide fast turn on not only adjacent to the Zener zones but throughout the base layer. This can be accomplished without the use of extra mask layers, thereby reducing processing complexity and saving on costs.

Figure 33:
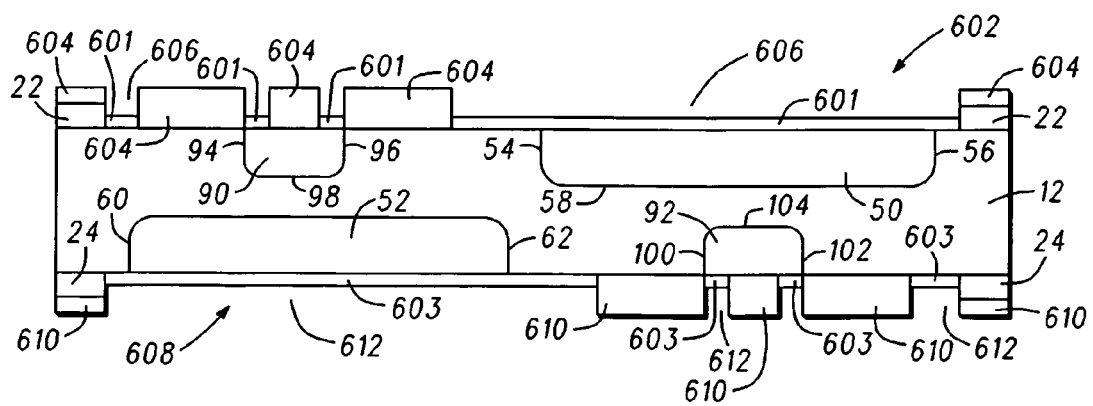
FIG. 33 is a cross-sectional view of a semiconductor component at an early stage of manufacture in accordance with another embodiment of the present invention.

FIG. 33 is a cross-sectional view of a portion of a transient voltage suppressor device 600 at an early stage of manufacture in accordance with another embodiment of the present invention. The beginning steps for manufacturing transient voltage suppressor device 600 may be the similar to those described with reference to FIGS. 1-5 for transient voltage suppressor device 10. Thus, the description of FIG. 33 continues from the description of FIG. 5. What is shown in FIG. 33 are etch masks 602 and 608 formed over dielectric layers 22 and 24 and portions of surfaces 14 and 16, respectively. More particularly, a layer of photoresist is formed on predeposition layer 118, dielectric layer 22, and dielectric layer 70 and a layer of photoresist is formed on predeposition layer 120, dielectric layer 24, and dielectric layer 72 using techniques known to those skilled in the art. The photoresist layer on predeposition layer 118 and dielectric layers 22 and 70 is patterned to form an etch mask 602 having masking features 604 and openings 606 and the photoresist layer on predeposition layer 120 and dielectric layers 24 and 72 is patterned to form an etch mask 608 having masking features 610 and openings 612. Openings 606 expose doped region 90, a portion of doped region 50, and portions of substrate 12 adjacent to doped regions 50 and 90 and openings 612 expose doped region 92, a portion of doped region 52, and portions of substrate 12 adjacent to doped regions 52 and 92. Doped regions 50 and 52 are referred to as anode regions and doped regions 90 and 92 are referred to as cathode regions.

An impurity material of P type conductivity is deposited on the portions of surfaces 14 and 16 exposed by openings 606 and 612, respectively, to form predeposition layers. By way of example, the impurity material is boron and is deposited to have a resistivity ranging from about 10 Ω/square to about 400 Ω/square. Suitable sources of boron include boron trichloride, diborane, or the like. The technique for disposing the boron on surfaces 14 and 16 is not a limitation of the present invention. It may be deposited, sprayed-on, spun-on, implanted using ion implantation, or the like. After forming the predeposition layers, etch masks 602 and 608 are removed and the remaining portions of surfaces 26 and 28 are cleaned using, for example, dilute hydrofluoric acid. Cleaning these surfaces removes the portions of the predeposition layers from surfaces 26 and 28, leaving predeposition layers 601 and 603. Predeposition layers 601 and 603 may be referred to as cathode predeposition layers.

Figure 34:
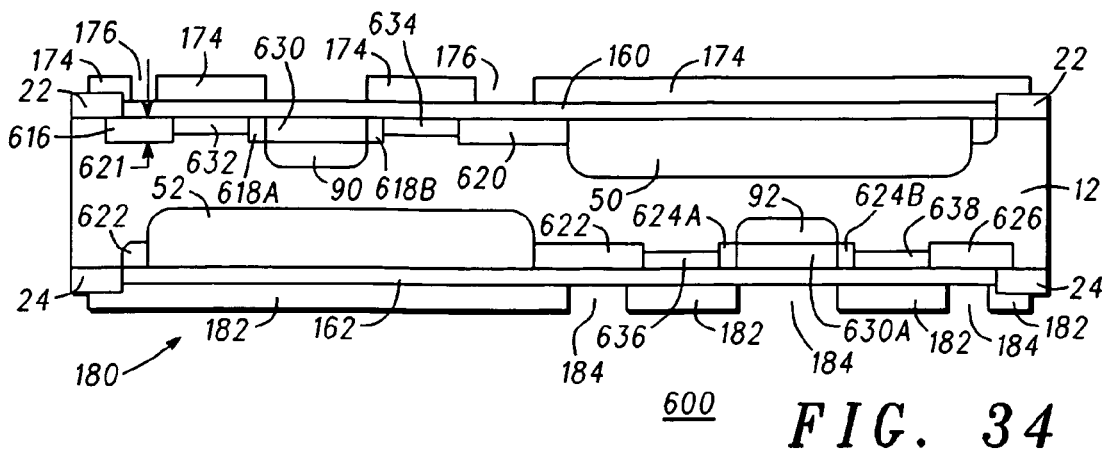
FIG. 34 is a cross-sectional view of the semiconductor component of FIG. 33 at a later stage of manufacture.

Referring now to FIG. 34, the impurity material of predeposition layers 601 and 603 is driven into semiconductor substrate 12 to form doped regions 616, 618A, 618B, 620, 622, 624A, 624B, and 626. Doped regions 616, 618A, 618B, 620, 622, 624A, 624B, and 626 are referred to as cathode regions. The drive-in is performed for a time ranging from about 1 hour to about 20 hours at a temperature ranging from about 1,250° C. to about 1,280° C. Doped regions 616, 618A, 618B, and 620 extend from surface 14 into semiconductor substrate 12. Doped regions 622, 624A, 624B, and 626 extend from surface 16 into semiconductor substrate 12. Doped regions 616, 618A, 618B, and 620 have a diffusion depth indicated by reference character 621 and doped regions 622, 624A, 624B, and 626 have a diffusion depth indicated by reference character 627. Because a portion of masking structure 604 is over doped region 90, the concentration of impurity material or dopant in breakdown region 630 is lower than the concentration of impurity material or dopant in doped regions 616, 618A, 618B, and 620. Breakdown region 630 is the region of substrate 12 that is between doped regions 618A and 618B and between surface 14 and doped region 90. In addition, masking features 604 block dopant from entering a portion 632 of the regions between doped regions 616 and 618A and from entering a portion 634 of the regions between doped regions 618B and 620. Masking features 610 block dopant from entering a portion 636 of the regions between doped regions 622 and 624 and from entering a portion 638 of the regions between doped regions 624 and 626. Driving in predeposition layers 138 and 140, i.e., forming doped regions 616, 618A, 618B, 620, 622, 624, and 626 oxidizes the exposed portions of surfaces 14 and 16 thereby forming oxide or dielectric layers 160 and 162, respectively. Oxide layers 160 and 162 have thicknesses ranging from about 5,000 Å to about 25,000 Å. As those skilled in the art are aware, oxidizing a semiconductor material such as silicon consumes portions of the silicon. Thus, oxide layers 160 and 162 extend below surfaces 14 and 16, respectively.

Because a portion of masking structure 610 is over doped region 92, the concentration of impurity material or dopant in breakdown region 630A is lower than the concentration of impurity material or dopant in doped regions 622, 624A, 624B, and 626. Breakdown region 630A is the region of substrate 12 that is between doped regions 624A and 624B and between surface 14 and doped region 92. In addition, masking features 610 block dopant from entering a portion 636 of the regions between doped regions 622 and 624A and from entering a portion 638 of the regions between doped regions 624B and 626. Driving in predeposition layers 138 and 140, i.e., forming doped regions 616, 618A, 618B, 620, 622, 624A, 624B, and 626 oxidizes the exposed portions of surfaces 14 and 16 thereby forming oxide or dielectric layers 160 and 162, respectively. Oxide layers 160 and 162 have thicknesses ranging from about 5,000 Å to about 25,000 Å. As those skilled in the art are aware, oxidizing a semiconductor material such as silicon consumes portions of the silicon. Thus, oxide layers 160 and 162 extend below surfaces 14 and 16, respectively.

A layer of photoresist is formed on dielectric layer 22 and dielectric layer 160 and a layer of photoresist is formed dielectric layer 24 and dielectric layer 162 using techniques known to those skilled in the art. The photoresist layer on dielectric layers 22 and 160 is patterned to form an etch mask 172 having masking features 174 and openings 176 and the photoresist layer on dielectric layers 24 and 162 is patterned to form an etch mask 180 having masking features 182 and openings 184.

Figure 35:
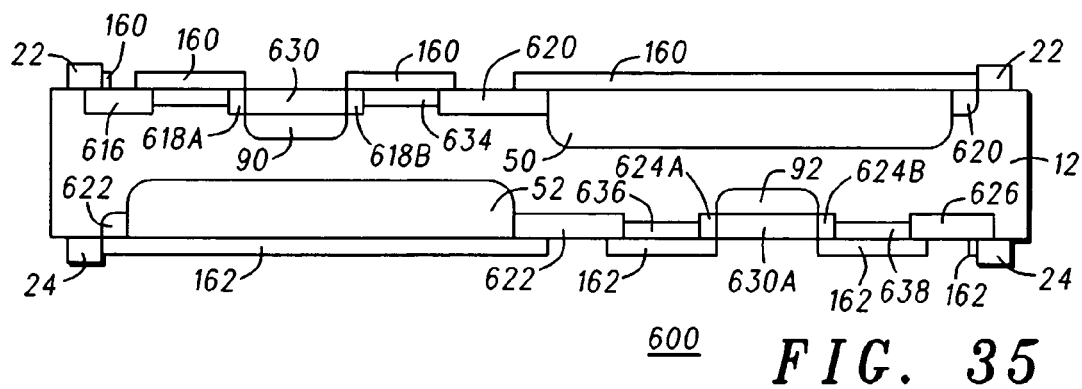
FIG. 35 is a cross-sectional view of the semiconductor component of FIG. 34 at a later stage of manufacture.

Referring now to FIG. 35, the exposed portions of dielectric layers 22, 24, 160, and 162 are anisotropically etched using either a dry etch or a wet etch to expose portions of doped regions 616, 620, 622, and 626 and to expose breakdown regions 630 and 630A. By way of example, the exposed portions of dielectric layers 22, 24, 160, and 162 are etched using hydrofluoric (HF) acid. Etch masks 172 and 180 are removed.

Figure 36:
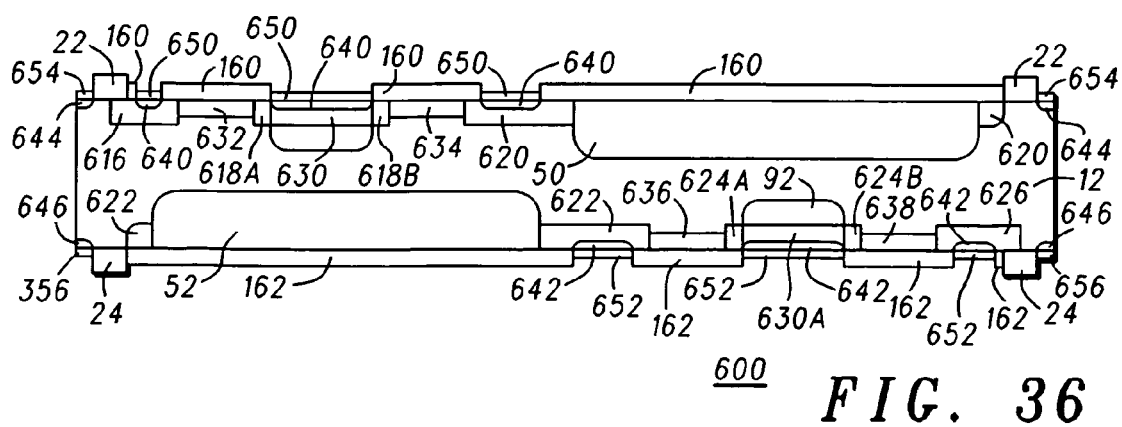
FIG. 36 is a cross-sectional view of the semiconductor component of FIG. 35 at a later stage of manufacture.

Referring now to FIG. 36, an impurity material of N-type conductivity is deposited on the exposed portions of doped regions 616, 620, 622, and 626 and on the exposed portions of breakdown regions 630 and 630A to form predeposition layers 640 and 642, respectively. The impurity material of N-type conductivity is also deposited on the exposed portions of surfaces 14 and 16 to form predeposition layers 644 and 646, respectively. By way of example, the impurity material is phosphorus or a phosphorus containing material that is deposited to have a resistivity ranging from about 0.25 Ω/square to about 10 Ω/square. Suitable sources of phosphorus include phosphorus oxytrichloride ($POCl_3$), phosphine ($PH_3$), phosphorus pentaoxide, or the like. The phosphorus can be disposed on doped regions 616, 620, 622, and 626 and on the exposed portions of breakdown region 630 and the exposed portions of surfaces 14 and 16 by ion implantation.

An oxide layer 650 having thicknesses ranging from about 500 Å to about 10,000 Å is formed from the exposed portions of doped regions 616 and 620 and on the exposed portions of breakdown region 630 that have predeposition layer 640 and an oxide layer 652 having a thickness ranging from about 500 Å to about 10,000 Å is formed from the exposed portions of doped regions 622, and 626 and on the exposed portions of breakdown region 630A that have predeposition layer 642. In addition, oxide layers 654 and 656 having thicknesses ranging from about 500 Å to about 10,000 Å are formed from the exposed portions of substrate 12. By way of oxide layers 650, 652, 654, and 656 are formed in a dry ambient at a temperature ranging from about 970° C. to about 1,200° C. for a time ranging from about one minute to about one hundred minutes.

Figure 37:
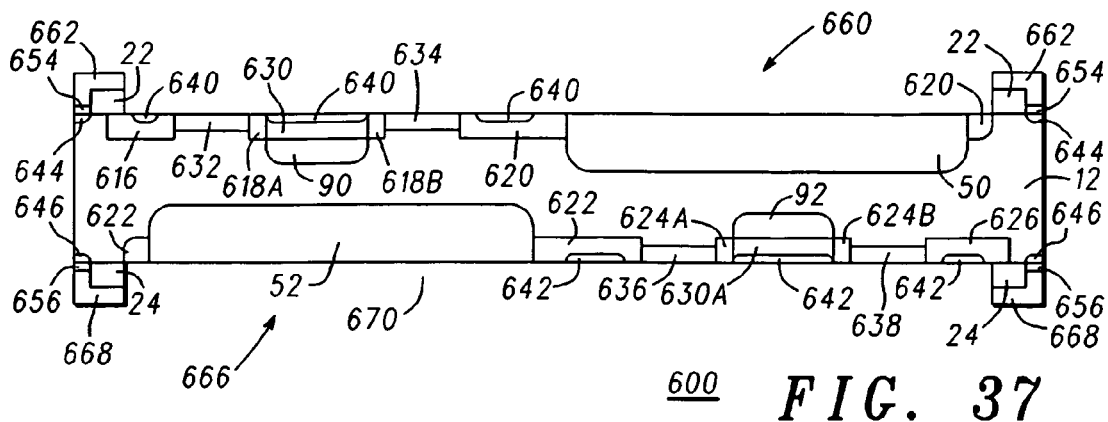
FIG. 37 is a cross-sectional view of the semiconductor component of FIG. 36 at a later stage of manufacture.

Referring now to FIG. 37, a layer of photoresist is formed on dielectric layers 22, 160, 650, and 654 and a layer of photoresist is formed dielectric layers 24, 162, 652, and 656 using techniques known to those skilled in the art. The photoresist layer on dielectric layers 22, 160, 650, and 654 is patterned to form an etch mask 660 having masking features 662 and an opening 664 and the photoresist layer on dielectric layers 24, 162, 652, and 656 is patterned to form an etch mask 666 having masking features 668 and an opening 670. Opening 664 exposes portions dielectric layers 160 and 650 and opening 670 exposes dielectric layers 162 and 652. Dielectric layers 160, 650, 162, and 652 are anisotropically etched using either a dry etch or a wet etch to expose doped regions 616, 618A, 618B, 620, 622, 624A, 624B, and 626 and predeposition layers 640 and 642. By way of example, the dielectric layers 160, 650, 162, and 652 are etched using hydrofluoric (HF) acid. Etch masks 660 and 666 are removed.

Alternatively, passivating layers such as, for example, SIPOS, nitride, oxide, or the like may be formed on dielectric layers 22, 24, 160, 162, 650, 652, 654, and 656 rather than forming etch masks 660 and 666. The passivating layers are then patterned to expose dielectric layers 160, 162, 650, and 652.

Figure 38:
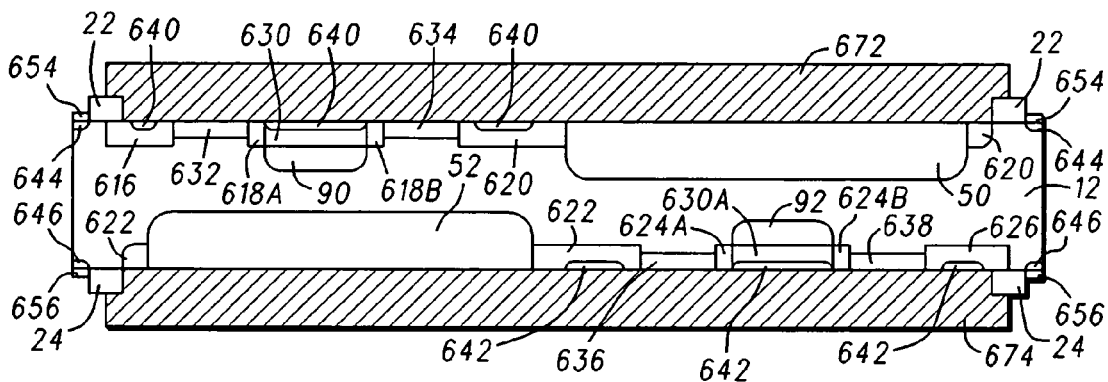
FIG. 38 is a cross-sectional view of the semiconductor component of FIG. 37 at a later stage of manufacture.

Referring now to FIG. 38, a layer of aluminum having a thickness ranging from about one μm to about twenty μm is formed on dielectric layers 22 and 654 and on the exposed portions of doped regions 50, 616, 618A, 618B, and 620, on the exposed portions of breakdown region 632 and 634, and on predeposition layers 640 and a layer of aluminum having a thickness ranging from about one μm to about twenty μm is formed on dielectric layers 24 and 656, on the exposed portions of doped regions 52, 622, 624A, 624B, and 626, on the exposed portions of localized breakdown regions 636 and 638, and predeposition layers 642. The aluminum layers may be formed by evaporation or other techniques known to those skilled in the art. The layers of aluminum are patterned so that a portion 672 remains over doped regions 50, 616, 618A, 618B, and 620, the exposed portions of breakdown region 632 and 634, and predeposition layers 640 and a portion 674 remains over 52, 622, 624A, 624B, 626, the exposed portions of localized breakdown regions 636 and 638, and predeposition layers 642. Portions 672 and 674 are also referred to as an aluminum layers.

Figure 39:
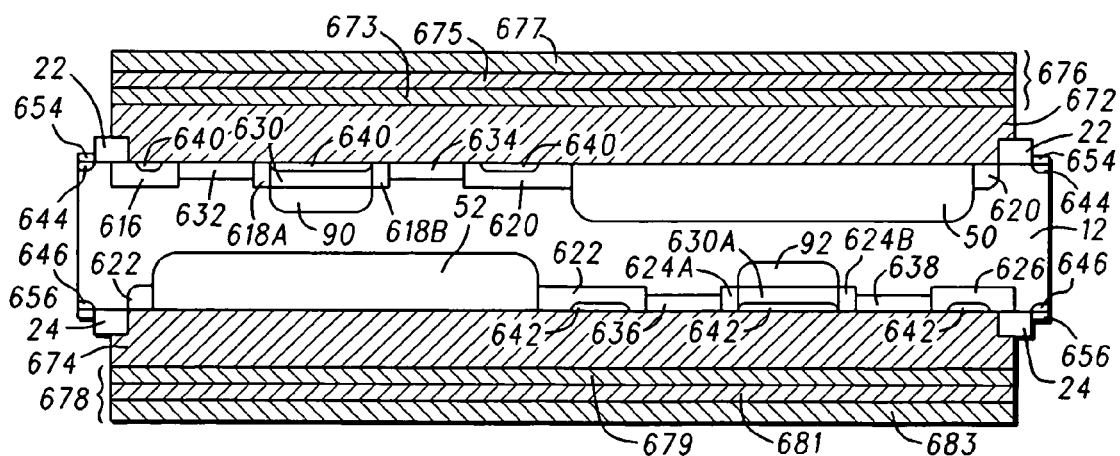
FIG. 39 is a cross-sectional view of the semiconductor component of FIG. 38 at a later stage of manufacture.

Referring now to FIG. 39, a layer of titanium 673 having a thickness ranging from about 0.1 μm to about 1 μm is formed on the dielectric layers 22 and 654 and on aluminum layer 672 and a layer of titanium 679 having a thickness ranging from about 0.1 μm to about 1 μm is formed on dielectric layers 24 and 656 and on aluminum layer 674. A layer of nitride 675 is formed on titanium layer 673 and a layer of nitride 681 is formed on titanium layer 679. A layer of silver 677 is formed on nitride layer 675 and a layer of silver 683 is formed on nitride layer 681. Titanium layers 673 and 679, nitride layers 675 and 681, and silver layers 677 and 683 may be formed by evaporation or other techniques known to those skilled in the art. Titanium layers 673 and 679, nitride layers 675 and 681, and silver layers 677 and 683 are patterned so that a portion 676 over aluminum layer 672 remains and portion 678 over aluminum layer 674 remains. Portions 676 and 678 are also referred to as contact structures. Like transient voltage suppressor 550, an advantage of transient voltage suppressor 600 is that it includes a lower gate dopant concentration in the Zener region and a heavier gate dopant concentration in the non-Zener regions, i.e., the remaining device active region, which serve as triggers for fast turn on. In addition, the selective introduction of lower gate doping can be distributed to enhance the turn on speed. The low carrier concentration regions with high gain can be distributed to provide fast turn on not only adjacent to the Zener zones but throughout the base layer. This can be accomplished without the use of extra mask layers, thereby reducing processing complexity and saving on costs.

By now it should be appreciated that a transient voltage suppressor and methods for manufacturing the transient voltage suppressor and compensating for gain in the transient voltage suppressor have been provided. A transient voltage suppressor may be referred to as a transient voltage suppressor device or a transient voltage suppression device. In accordance with an embodiment, the transient voltage suppressor is comprised of Zener zone or region, a gate region, a cathode region, and an anode region. A portion of the gate region is vertically adjacent the Zener zone and a portion of the cathode region is vertically adjacent the portion of the gate region that is vertically adjacent the Zener zone. Other portions of the gate region and the cathode region are laterally adjacent to the Zener zone. Thus, the transient voltage suppressor has a Zener zone or region, which defines the Zener voltage of the transient voltage suppressor, and a non-Zener zone or region, i.e., a portion of the transient voltage suppressor that is out of or away from the Zener zone. In accordance with embodiments of the present invention, the portion of the gate region that is vertically adjacent to the Zener zone has a dopant concentration that is different from the portion of the gate region that is out of or away from the Zener zone. The dopant concentration of the portion of the gate region that is vertically adjacent the Zener zone can be greater than or less than the dopant concentration of the portion of the gate region that is away from the Zener zone. This provides gain compensation by making the NPN transistor in the Zener zone have the same gain as the NPN transistor out of the Zener zone, i.e., gain compensation is provided by adjusting the Rbb of the NPN transistor. Including gain compensation uniformly distributes current across the cathode region during a surge, which improves the performance of the transient voltage suppressor. In addition, including gain compensation allows the Zener zone or region to be small leading to lower capacitance and insertion losses.

In accordance with another embodiment, a uni-directional or a bi-directional transient voltage suppressor is provided that has localized breakdown regions under the gate and cathode regions where the gate region has two concentrations. The dopant concentration of the portion of the gate region above the breakdown region is greater than or higher than the dopant concentration in the remaining portions of the gate region.

In accordance with another embodiment, a uni-directional or a bi-directional transient voltage suppressor is provided that has localized breakdown regions under the gate and cathode regions where the gate doping has been selectively introduced into a breakdown region that has been created previously.

In accordance with another embodiment, a uni-directional or a bi-directional transient voltage suppressor is provided that has a cross-pattern localized breakdown region.

In accordance with another embodiment, the method comprises balancing the active regions by compensating for the gain of an NPN transistor in a Zener region.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a transient voltage suppressor, comprising:
   providing a semiconductor substrate having first and second major surfaces, the first and second major surfaces on opposite sides of the semiconductor substrate and non coplanar;
   forming an active region from the semiconductor substrate, the active region having a Zener region extending from the first major surface and a portion away from the Zener region extending from the second major surface;
   forming a first gate region in the Zener region and a second gate region in the portion of the active region away from the Zener region; and
   adjusting a dopant concentration of the first gate region to be different from a dopant concentration of the second gate region.

2. The method of claim 1, wherein adjusting the dopant concentration of the first gate region includes increasing the dopant concentration.

3. The method of claim 1, wherein adjusting the dopant concentration of the first gate region includes decreasing the dopant concentration.

4. A method for manufacturing a transient voltage suppressor, comprising:
   providing a semiconductor substrate having first and second major surfaces, the first and second major surfaces on opposite sides of the semiconductor substrate and non coplanar;
   forming a first gate region in the semiconductor substrate, the first gate region extending from the first major surface into the semiconductor substrate and having first, second, and third portions, wherein the first portion is vertically adjacent the second portion and the third portion is laterally adjacent the first and second portions;
   forming a second gate region in the semiconductor substrate, the second gate region extending from the second major surface into the semiconductor substrate and having first, second, and third portions, wherein the first portion of the second gate region is vertically adjacent the second portion of the second gate region and the third portion of the second gate region is laterally adjacent the first and second portions of the second gate region;
   forming a first cathode region in the first portion of the first gate region;
   forming a first cathode region in the first portion of the first gate region;
   forming a second cathode region in the first portion of the second gate region;
   forming a first anode region in the semiconductor substrate, the first anode region extending from the second major surface into the semiconductor substrate;
   forming a second anode region in the semiconductor substrate, the second anode region extending from the second major surface into the semiconductor substrate;
   forming a first doped region in the semiconductor substrate, the first doped region vertically adjacent the second portion of the first gate region;
   forming a second doped region in the semiconductor substrate, the second doped region vertically adjacent the second portion of the second gate region;
   adjusting the dopant concentration of the second portion of the first gate region; and
   adjusting the dopant concentration of the second portion of the second gate region.

5. The method of claim 4, wherein:
   providing the semiconductor substrate includes providing the semiconductor substrate to be of a first conductivity type;
   forming the first anode region to be of a second conductivity type; and
   forming the first cathode region and the first doped region to be of the first conductivity type.

6. The method of claim 5, wherein adjusting the dopant concentration of the second portion of the first gate region includes increasing the dopant concentration of the second portion of the first gate region.

7. The method of claim 5, wherein adjusting the dopant concentration of the second portion of the first gate region includes forming the second portion of the first gate region to have a lower dopant concentration than the third portion of the first gate region.

8. The method of claim 5, further including forming an isolation structure extending from the first major surface to the second major surface.

9. A method for manufacturing a transient voltage suppressor, comprising:
   providing a semiconductor substrate of a first conductivity type, the semiconductor substrate having first and second major surfaces;
   forming a first gate region of a second conductivity type in the semiconductor substrate, the first gate region extending from the first major surface into the semiconductor substrate, wherein the first conductivity type is N-type conductivity and the second conductivity type is P-type conductivity;
   forming a first anode region of the second conductivity type extending from the second major surface into the semiconductor substrate;
   forming a first cathode region of the first conductivity type in a first portion of the gate region;
   forming a first Zener region of the first conductivity type in a portion of the substrate adjacent the first gate region; and
   forming a first gain compensation region of the second conductivity type from a second portion of the gate region, the second portion of the gate region between the first portion of the first gate region and the first Zener region.

10. A method for manufacturing a transient voltage suppressor, comprising:
    providing a semiconductor substrate of a first conductivity type, the semiconductor substrate having first and second major surfaces;
    forming a first gate region of a second conductivity type in the semiconductor substrate, the first gate region extending from the first major surface into the semiconductor substrate;
    forming a first cathode region of the first conductivity type in a first portion of the gate region;
    forming a first Zener region of the first conductivity type in a portion of the substrate adjacent the first gate region;
    forming a first gain compensation region of the second conductivity type from a second portion of the gate region, the second portion of the gate region between the first portion of the first gate region and the first Zener region;
    forming a second gate region of a second conductivity type in the semiconductor substrate, the second gate region extending from the second major surface into the semiconductor substrate;
    forming a second cathode region of the first conductivity type in a first portion of the second gate region;
    forming a second Zener region of the first conductivity type in a portion of the substrate adjacent the second gate region; and
    forming a second gain compensation region of the second conductivity type from a second portion of the second gate region, the second portion of the second gate region between the first portion of the second gate region and the second Zener region.

11. The method of claim 10, further including forming a second anode region of the second conductivity type extending from the second major surface into the semiconductor substrate.

12. The method of claim 10, wherein forming the first and second gain compensation regions includes increasing a dopant concentration in the second portion of the first gate region and the second portion of the second gate region to be greater than a dopant concentration of the first and second gate regions.

13. A method for manufacturing a transient voltage suppressor, comprising:
    providing a semiconductor substrate of a first conductivity type, the semiconductor substrate having first and second major surfaces;
    forming a first gate region of a second conductivity type in the semiconductor substrate, the first gate region extending from the first major surface into the semiconductor substrate, the first gate region having first and second portions, the first portion of the first gate region having first and second sub-portions, and the second portion of the first gate region having a lower dopant concentration than the first portion of the first gate region;
    forming a first cathode region of the first conductivity type in the first sub-portion of the first portion of the first gate region;
    forming a first Zener region of the first conductivity type in a portion of the semiconductor substrate adjacent the second sub-portion of the first gate region;
    forming a second gate region of a second conductivity type in the semiconductor substrate, the second gate region extending from the second major surface into the semiconductor substrate, the second gate region having first and second portions, the first portion of the second gate region having first and second sub-portions, the second portion of the second gate region having a lower dopant concentration than the first portion of the second gate region;
    forming a second cathode region of the first conductivity type in the first sub-portion of the first portion of the second gate region; and
    forming a second Zener region of the first conductivity type in a portion of the semiconductor substrate adjacent the second sub-portion of the second gate region.

14. The method of claim 13, further including forming a first anode region extending from the second major surface into the semiconductor substrate.

* * * * *